(12) United States Patent
Lim et al.

(10) Patent No.: US 12,334,478 B2
(45) Date of Patent: Jun. 17, 2025

(54) LIGHT EMITTING DEVICE AND DISPLAY DEVICE HAVING SAME

(71) Applicant: Samsung Display Co., Ltd., Yongin-si (KR)

(72) Inventors: Jae Ik Lim, Yongin-si (KR); Eun A Yang, Yongin-si (KR); Hae Yun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1133 days.

(21) Appl. No.: 17/257,556

(22) PCT Filed: Sep. 27, 2018

(86) PCT No.: PCT/KR2018/011346
§ 371 (c)(1),
(2) Date: Dec. 31, 2020

(87) PCT Pub. No.: WO2020/013386
PCT Pub. Date: Jan. 16, 2020

(65) Prior Publication Data
US 2021/0288033 A1    Sep. 16, 2021

(30) Foreign Application Priority Data
Jul. 9, 2018    (KR) .................... 10-2018-0079540

(51) Int. Cl.
*H01L 25/075*    (2006.01)
*H10D 86/40*    (2025.01)
(Continued)

(52) U.S. Cl.
CPC ......... *H01L 25/0753* (2013.01); *H10D 86/40* (2025.01); *H10D 86/60* (2025.01); *H10H 20/821* (2025.01); *H10H 20/857* (2025.01)

(58) Field of Classification Search
None
See application file for complete search history.

(56) References Cited

U.S. PATENT DOCUMENTS 9,557,573 B2    1/2017    Hilarius et al.
9,773,761 B2 *  9/2017    Do ...................... H01L 25/0753
(Continued)

FOREIGN PATENT DOCUMENTS

KR    10-2016-0175770    * 12/2016
KR    10-1730977 B1       4/2017
(Continued)

OTHER PUBLICATIONS

International Search Report corresponding to PCT/KR2018/011346, dated Apr. 9, 2019, 4 pages.

*Primary Examiner* — Nishath Yasmeen
(74) *Attorney, Agent, or Firm* — Womble Bond Dickinson (US) LLP

(57) ABSTRACT

A light emitting device may include: a substrate including a plurality of unit light emitting regions; at least one first light emitting element having a first end portion and a second end portion in a first direction; at least one second light emitting element having a first end portion and a second end portion in a second direction intersecting the first direction; a first electrode connected to any one of the first and second end portions of each of the first and second light emitting elements and a second electrode connected to the other of the first and second end portions of each of the first and second light emitting elements; a first alignment line extending along the second direction on the substrate, the first alignment line being connected to the first electrode; and a second alignment line connected to the second electrode.

20 Claims, 31 Drawing Sheets

(51) Int. Cl.
*H10D 86/60* (2025.01)
*H10H 20/821* (2025.01)
*H10H 20/857* (2025.01)

(56) References Cited

U.S. PATENT DOCUMENTS

| | | | |
|---|---|---|---|
| 10,062,804 B2* | 8/2018 | Do | B23K 26/00 |
| 10,134,950 B2 | 11/2018 | Ting et al. | |
| 10,367,123 B2* | 7/2019 | Im | H10H 20/855 |
| 10,672,946 B2* | 6/2020 | Cho | H10H 20/825 |
| 10,818,647 B2* | 10/2020 | Kim | H10D 86/441 |
| 2011/0316843 A1 | 12/2011 | Sakurai et al. | |
| 2013/0027623 A1* | 1/2013 | Negishi | F21K 9/00 |
| | | | 438/30 |
| 2016/0211245 A1* | 7/2016 | Do | H10H 20/84 |
| 2017/0317228 A1 | 11/2017 | Sung | |
| 2017/0338372 A1* | 11/2017 | Teraguchi | H10H 20/819 |
| 2017/0358563 A1 | 12/2017 | Cho et al. | |
| 2018/0012876 A1 | 1/2018 | Kim et al. | |
| 2018/0019369 A1* | 1/2018 | Cho | H01L 25/0753 |
| 2018/0019377 A1* | 1/2018 | Kim | H10H 20/01335 |
| 2018/0026074 A1 | 1/2018 | Lee et al. | |
| 2018/0047804 A1 | 2/2018 | Zhou et al. | |
| 2018/0175009 A1* | 6/2018 | Kim | H10H 20/8316 |
| 2018/0175106 A1 | 6/2018 | Kim et al. | |
| 2018/0204895 A1* | 7/2018 | Lin | G09G 3/3291 |
| 2019/0019930 A1 | 1/2019 | Do et al. | |

FOREIGN PATENT DOCUMENTS

| | | |
|---|---|---|
| KR | 10-2017-0141305 A | 12/2017 |
| KR | 10-2018-0007025 A | 1/2018 |
| KR | 10-2018-0007376 A | 1/2018 |
| KR | 10-2018-0011404 A | 2/2018 |
| KR | 10-2018-0055021 A | 5/2018 |
| KR | 10-2018-0072909 A | 7/2018 |
| TW | 201807840 A | 3/2018 |

* cited by examiner

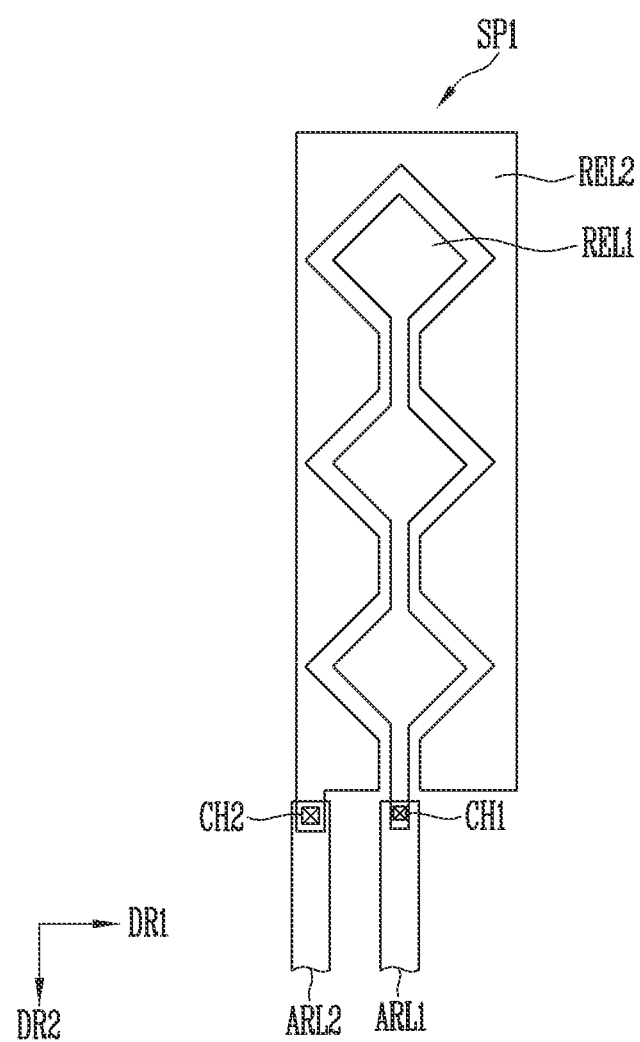

LIGHT EMITTING DEVICE AND DISPLAY DEVICE HAVING SAME

CROSS-REFERENCE TO RELATED APPLICATION(S)

This application is a U.S. National Phase Patent Application of International Patent Application Number PCT/KR2018/011346, filed on Sep. 27, 2018, which claims priority to Korean Patent Application Number 10-2018-0079540, filed on Jul. 9, 2018, the entire content of all of which is incorporated herein by reference.

BACKGROUND

1. Field

The present invention relates a light emitting device and a display device having the same.

2. Description of Related Art

Light emitting diodes (hereinafter, referred to as LEDs) exhibit relatively satisfactory durability even in poor environmental conditions and have excellent performance in terms of lifespan and luminance. Recently, studies for applying such LEDs to various display devices have been actively conducted.

As a part of such studies, there has been developed a technique for fabricating a micro bar type LED that is small to a degree of micro or nano scale using an inorganic crystal structure, e.g., a structure in which a nitride-based semiconductor is grown. For example, the bar type LED may be fabricated in a size small enough to constitute a pixel of a self-luminescent display device, and the like.

SUMMARY

An object of the present invention is to provide a light emitting device having a bar type LED and a display device having the same.

According to an aspect of the present invention, there is provided a light emitting device including: a substrate including a plurality of unit light emitting regions; at least one first light emitting element disposed on the substrate, the at least one first light emitting element having a first end portion and a second end portion in a first direction; at least one second light emitting element having a first end portion and a second end portion in a second direction intersecting the first direction; a first electrode connected to any one of the first and second end portions of each of the first and second light emitting elements and a second electrode connected to the other of the first and second end portions of each of the first and second light emitting elements; a first alignment line extending along the second direction on the substrate, the first alignment line being connected to the first electrode; and a second alignment line spaced apart from the first alignment line at a certain distance, the second alignment line being connected to the second electrode.

According to an embodiment of the present invention, each unit light emitting region may include a first sub-light emitting region in which the first light emitting element is provided and a second sub-light emitting region in which the second light emitting element is provided.

According to an embodiment of the present invention, the first electrode may include a (1-1)th electrode provided in the first sub-light emitting region and a (1-2)th electrode provided in the second sub-light emitting region. The second electrode may include a (2-1)th electrode provided in the first sub-light emitting region and a (2-2)th electrode provided in the second sub-light emitting region.

According to an embodiment of the present invention, the (1-1)th electrode and the (2-1)th electrode may extend along the second direction when viewed on a plane. The (1-2)th electrode and the (2-2)th electrode may extend along the first direction when viewed on a plane.

According to an embodiment of the present invention, a distance between the (1-1)th electrode and the (2-1)th electrode may be equal to that between the (1-2)th electrode and the (2-2)th electrode.

According to an embodiment of the present invention, the light emitting device may further include: a first connection line extending in the first direction on the substrate, the first connection line electrically connecting the first alignment line and the first electrode; and a second connection line extending in parallel to the first connection line on the substrate, the second connection line electrically connecting the second alignment line and the second electrode.

According to an embodiment of the present invention, the (1-1)th electrode may branch off to the first sub-light emitting region along the second direction from the first connection line, the (2-1)th electrode may branch off to the first sub-light emitting region along the second direction from the second connection line, and the (1-1)th electrode and the (2-1)th electrode may be alternately disposed along the first direction in the first sub-light emitting region.

According to an embodiment of the present invention, the (1-2)th electrode may branch off to the second sub-light emitting region along the first direction from the first alignment line, the (2-2)th electrode may branch off to the second sub-light emitting region along the first direction from the second alignment line, and the (1-2)th electrode and the (2-2)th electrode may be alternately disposed along the second direction in the second sub-light emitting region.

According to an embodiment of the present invention, the first connection line may include one end portion connected to the first alignment line and the other end portion opposite to the one end portion. The other end portion may have a round shape.

According to an embodiment of the present invention, a distance between one of the (1-2)th and (2-2)th electrodes, which is disposed at an uppermost side of the second sub-light emitting region, and the first connection line may be larger than that between the (1-2)th electrode and the (2-2)th electrode.

According to an embodiment of the present invention, the light emitting device may further include: a first bank, or partition wall, provided between the substrate and the first electrode; a second bank, or partition wall, provided between the substrate and the second electrode, the second partition wall being spaced apart from the first partition wall at a certain distance; a first contact electrode provided on the first electrode, the first contact electrode connecting any one of first and second end portions of a corresponding light emitting element and the first electrode; and a second contact electrode provided on the second electrode, the second contact electrode connecting the other of the first and second end portions of the corresponding light emitting element and the second electrode.

According to an embodiment of the present invention, the light emitting device may further include: a first insulating layer disposed between the substrate and the first and second light emitting elements; a second insulating layer provided over the first and second light emitting elements, the second insulating layer exposing the first and second end portions of each of the first and second light emitting elements; a third insulating layer provided over the first contact electrode to cover the first contact electrode; and a fourth insulating layer provided over the second contact electrode to cover the second contact electrode.

According to an embodiment of the present invention, the light emitting device may further include, when viewed on a plane, a first insulating pattern overlapping with a portion of the first alignment line and a second insulating pattern overlapping with a portion of the second alignment line. The first and second insulating patterns may be provided in the same layer as the first insulating layer, and shield a portion of an electric field formed between the first and second electrodes.

According to an embodiment of the present invention, the light emitting device may further include a first conductive pattern provided on the first insulating pattern and a second conductive pattern provided on the second insulating pattern. The first and second conductive patterns may be provided in the same layer as the first contact electrode.

According to an embodiment of the present invention, the first alignment line may be provided in the same layer as the first electrode, and be integrally provided with the first electrode. The second alignment line may be provided in the same layer as the second electrode, and be integrally provided with the second electrode.

According to an embodiment of the present invention, the first electrode may include a plurality of branch electrodes protruding along the first direction from the first alignment line, and the second electrode may include a plurality of protrusion electrodes arranged along the second direction and a plurality of voids provided between adjacent protrusion electrodes. Each of the branch electrodes may be provided to correspond to one void.

According to an embodiment of the present invention, the first electrode and the second electrode may be electrically separated from each other, and one of the first and second electrodes may have a shape surrounding the periphery of the other of the first and second electrodes.

According to an embodiment of the present invention, each of the first and second light emitting elements may include: a first semiconductor layer, or conductive semiconductor layer, doped with a first conductive dopant; a second semiconductor layer, or conductive semiconductor layer, doped with a second conductive dopant; and an active layer provided between the first conductive semiconductor layer and the second conductive semiconductor layer.

According to an embodiment of the present invention, each of the first and second light emitting elements may include a cylindrical column- or polygonal column-shaped light emitting diode having a micro or nano scale.

According to another aspect of the present invention, there is provided a display device having a light emitting device, the display device including: a substrate including a display region and a non-display region; a pixel circuit layer provided in the display region, the pixel circuit layer including at least one transistor; and a display element layer provided on the pixel circuit layer, the display element layer including a plurality of unit light emitting regions from which light is emitted.

According to an embodiment of the present invention, the display element layer may include: at least one first light emitting element disposed on the pixel circuit layer, the at least one first light emitting element having a first end portion and a second end portion in a first direction; at least one second light emitting element having a first end portion and a second end portion in a second direction intersecting the first direction; a first electrode connected to any one of the first and second end portions of each of the first and second light emitting elements and a second electrode connected to the other of the first and second end portions of each of the first and second light emitting elements, wherein the first electrode and the second electrode are provided on the pixel circuit layer; a first alignment line extending along the second direction on the pixel circuit layer, the first alignment line being connected to the first electrode; a second alignment line spaced apart from the first alignment line at a certain distance, the second alignment line being connected to the second electrode; a first contact electrode provided on the first electrode, the first contact electrode connecting any one of first and second end portions of a corresponding light emitting element and the first electrode; and a second contact electrode provided on the second electrode, the second contact electrode connecting the other of the first and second end portions of the corresponding light emitting element and the second electrode.

According to the present invention, there can be provided a light emitting device capable of improving the efficiency of light and a display device having the light emitting device.

BRIEF DESCRIPTION OF THE DRAWINGS

FIGS. 20A to 20D are plan views illustrating another embodiment of the first and second alignment lines and the first and second electrodes, which are disposed in one pixel, in the display device of FIG. 11.

DETAILED DESCRIPTION

Figure 1:
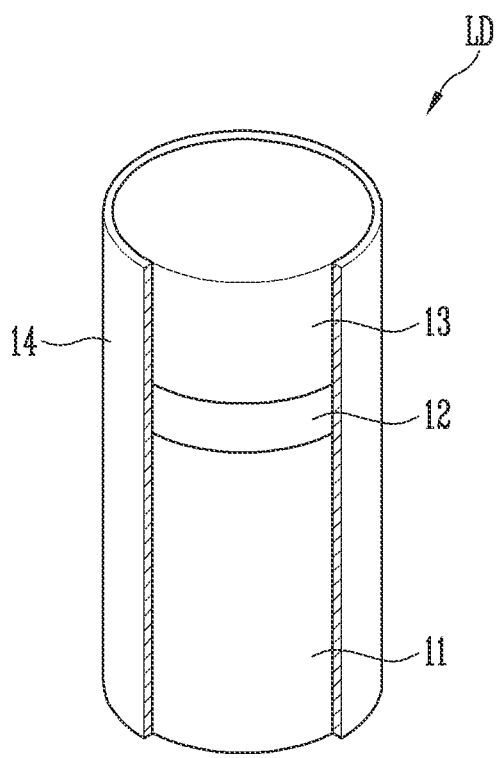
FIG. 1 is a perspective view illustrating a light emitting diode (LED) according to an embodiment of the present invention.

The present invention may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present invention. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, embodiments of the present invention will be described in detail with reference to the accompanying drawings.

FIG. 1 is a perspective view illustrating a light emitting diode according to an embodiment of the present invention. Although a cylindrical column-shaped bar type light emitting diode LD is illustrated in FIG. 1, the present invention is not limited thereto. The bar type light emitting diode LD is a light emitting element.

Referring to FIG. 1, the light emitting diode LD according to the embodiment of the present invention may include a first conductive semiconductor layer 11, a second conductive semiconductor layer 13, and an active layer 12 interposed between the first and second conductive semiconductor layers 11 and 13.

In an example, the light emitting diode LD may be implemented with a stack structure in which the first conductive semiconductor layer 11, the active layer 12, and the second conductive semiconductor layer 13 are sequentially stacked. For convenience of description, the light emitting diode LD is referred to as a "LED LD."

According to an embodiment of the present invention, the LED LD may be provided in a bar shape extending along one direction. When assuming that the extending direction of the LED LD is a length direction, the LED LD may have one end portion and the other end portion along the length direction.

In an embodiment of the present invention, one of the first and second conductive semiconductor layers 11 and 13 may be disposed at the one end portion, and the other of the first and second conductive semiconductor layers 11 and 13 may be disposed at the other end portion.

In an embodiment of the present invention, the LED LD may be provided in a cylindrical column shape, such as a bar type. However, the term "bar type" may include a rod-like shape or bar-like shape, which is long in its length direction (i.e., its aspect ratio is greater than 1), such as a cylindrical column or a polygonal column. For example, the LED LD may have a length greater than a diameter thereof.

The LED LD may be fabricated small enough to have a diameter and/or a length, for example, to a degree of micro or nano scale.

However, the size of the LED LD according to the embodiment of the present invention is not limited thereto, and the size of the LED LD may be changed to correspond to required conditions of a display device to which the LED LD is applied.

The first conductive semiconductor layer 11 may include, for example, at least one n-type semiconductor layer. For example, the first conductive semiconductor layer 11 may include at least one semiconductor material among InAlGaN, GaN, AlGaN, InGaN, AlN, and InN, and include a semiconductor layer doped with a first conductive dopant such as Si, Ge or Sn.

The material constituting the first conductive semiconductor layer 11 is not limited thereto, and various materials may be included in the first conductive semiconductor layer 11.

The active layer 12 is formed on the first conductive semiconductor layer 11, and may be formed in a single or multiple quantum well structure. According to an embodiment of the present invention, a clad layer (not shown) doped with a conductive dopant may be formed on the top and/or the bottom of the active layer 12. In an example, the clad layer may be implemented as an AlGaN layer or InAlGaN layer. In addition, it will be apparent that a material such as AlGaN or AlInGaN may also be used for the active layer 12.

When an electric field having a predetermined voltage or more is applied to both ends of the LED LD, the LED LD emits light when electron-hole pairs are combined in the active layer 12.

The second conductive semiconductor layer 13 is formed on the active layer 12, and may include a semiconductor layer having a type different from that of the first conductive semiconductor layer 11. In an example, the second conductive semiconductor layer 13 may include at least one p-type semiconductor layer. For example, the second conductive semiconductor layer 13 may include at least one semiconductor material among InAlGaN, GaN, AlGaN, InGaN, AlN, and InN, and include a semiconductor layer doped with a second conductive dopant such as Mg.

The material constituting the second conductive semiconductor layer 13 is not limited thereto, and various materials may be included in the second conductive semiconductor layer 13.

According to an embodiment of the present invention, the LED LD may further include another phosphor layer, another active layer, another semiconductor layer, and/or another electrode layer on the top and/or the bottom of each layer, in addition to the first conductive semiconductor layer 11, the active layer 12, and the second conductive semiconductor layer 13.

Also, the LED LD may further include an insulating film 14. However, according to an embodiment of the present invention, the insulating film 14 may be omitted, and may be provided to cover only portions of the first conductive semiconductor layer 11, the active layer 12, and the second conductive semiconductor layer 13.

For example, the insulating film 14 may be provided at a portion except both end portions of the LED LD, so that both the end portions of the LED LD can be exposed.

For convenience of description, FIG. 1 illustrates a state in which a portion of the insulating film 14 is removed. In an actual LED LD, the entire side surface of a cylinder may be surrounded by the insulating film 14.

The insulating film 14 may be provided to surround at least a portion of outer circumferential surfaces of the first conductive semiconductor layer 11, the active layer 12, and/or the second conductive semiconductor layer 13. In an example, the insulating film 14 may be provided to surround at least the outer circumferential surface of the active layer 12.

According to an embodiment of the present invention, the insulating film 14 may include a transparent insulating material. For example, the insulating film 14 may include at least one insulating material selected from the group consisting of $SiO_2$, $Si_3N_4$, $Al_2O_3$, and $TiO_2$. However, the present invention is not limited thereto and, various materials having insulating properties may be used.

When the insulating film 14 is provided in the LED LD, the active layer 12 can be prevented from being short-circuited with a first electrode (not shown) and/or a second electrode (not shown).

Further, when the insulating film 14 is formed, a surface defect occurring in the LED LD is minimized, so that the lifespan and efficiency of the LED LD can be improved. Further, when a plurality of LEDs LD are densely disposed, the insulating film 14 can prevent an unwanted short circuit that may occur between the LEDs LD.

The above-described LED LD may be used as a light emitting source for various display devices. In an example, the LED LD may be used as a light source device of lighting devices or self-luminescent display devices.

Figure 2A:
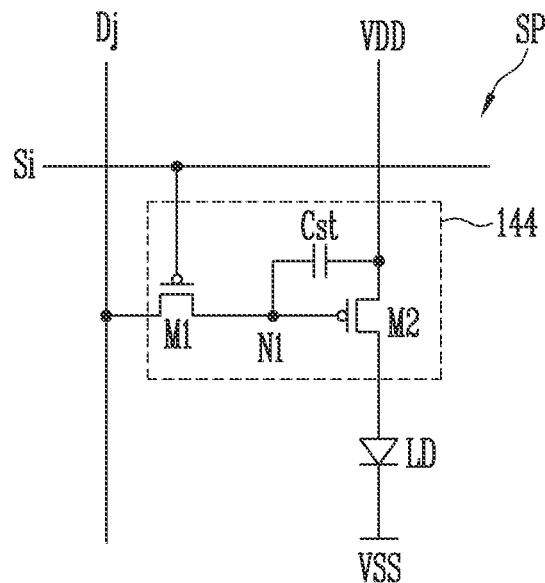
FIGS. 2A and 2B are circuit diagrams illustrating a unit light emitting region of a light emitting device according to an embodiment of the present invention.
Figure 2B:
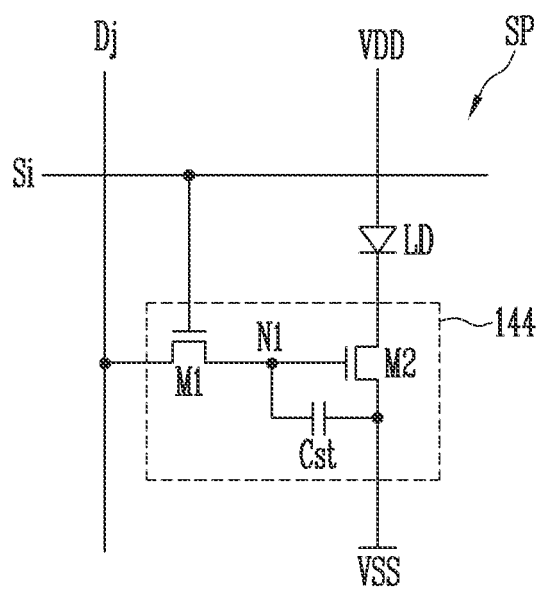

FIGS. 2A and 2B are circuit diagrams illustrating a unit light emitting region of a light emitting device according to an embodiment of the present invention.

In particular, FIGS. 2A and 2B illustrate examples of a sub-pixel constituting an active light emitting display panel. In an embodiment of the present invention, the unit light emitting region may be a pixel region of one sub-pixel.

Referring to FIG. 2A, a sub-pixel SP may include at least one LED LD and a driving circuit 144 connected to the LED LD to drive the LED LD.

A first electrode (e.g., an anode electrode) of the LED LD is connected to a first driving power source VDD via the driving circuit 144, and a second electrode (e.g., a cathode electrode) of the LED LD is connected to a second driving power source VSS.

The first driving power source VDD and the second driving power source VSS may have different potentials. In an example, the second driving power source VSS may have a potential lower by a threshold voltage of the LED LD than that of the first driving power source VDD.

The LED LD may emit light with a luminance corresponding to a driving current controlled by the driving circuit 144.

Meanwhile, although an embodiment in which only one LED LD is included in the sub-pixel SP is disclosed in FIG. 2A, the present invention is not limited thereto. For example, the sub-pixel SP may include a plurality of LEDs LD connected in parallel to each other.

According to an embodiment of the present invention, the driving circuit 144 may include first and second transistors M1 and M2 and a storage capacitor Cst. However, the structure of the driving circuit 144 is not limited to the embodiment shown in FIG. 2A.

A first electrode of the first transistor (switching transistor) M1 is connected to a data line Dj, and a second electrode of the first transistor M1 is connected to a first node N1. The first electrode and the second electrode of the first transistor M1 are different electrodes. For example, when the first electrode is a source electrode, the second electrode may be a drain electrode. In addition, a gate electrode of the first transistor M1 is connected to a scan line Si.

The first transistor M1 is turned on when a voltage (e.g., a low voltage) at which the first transistor M1 can be turned on is supplied from the scan line Si, to electrically connect the data line Dj and the first node N1. A data signal of a corresponding frame is supplied to the data line Dj. Accordingly, the data signal is transferred to the first node N1. The data signal transferred to the first node N1 is charged in the storage capacitor Cst.

A first electrode of the second transistor (driving transistor) M2 is connected to the first driving power source VDD, and a second electrode of the second transistor M2 is connected to the first electrode of the LED LD. In addition, a gate electrode of the second transistor M2 is connected to the first node N1. The second transistor M2 controls an amount of driving current supplied to the LED LD, corresponding to a voltage of the first node N1.

One electrode of the storage capacitor Cst is connected to the first driving power source VDD, and the other electrode of the storage capacitor Cst is connected to the first node N1. The storage capacitor Cst charges a voltage corresponding to the data signal supplied to the first node N1, and maintains the charged voltage until a data signal of a next frame is supplied.

For convenience, FIG. 2A illustrates the driving circuit 144 having a relatively simple structure, which includes the first transistor M1 for transferring the data signal to the inside of the sub-pixel SP, the storage capacitor Cst for storing the data signal, and the second transistor M2 for supplying a driving current corresponding to the data signal to the LED LD.

However, the present invention is not limited thereto, and the structure of the driving circuit 144 may be variously modified and implemented. In an example, it will be apparent that the driving circuit 144 may further include at least one transistor element such as a transistor element for compensating for a threshold voltage of the second transistor M2, a transistor element for initializing the first node N1, and/or a transistor for controlling a light emitting time of the LED LD, or other circuit elements such as a boosting capacitor for boosting a voltage of the first node N1.

Although FIG. 2A illustrates that both of the transistors, e.g., the first and second transistors M1 and M2 included in the driving circuit 144 are implemented with a P-type transistor, the present invention is not limited thereto. That is, at least one of the first and second transistors M1 and M2 may be implemented with an N-type transistor.

Referring to FIG. 2B, according to an embodiment of the present invention, the first and second transistors M1 and M2 may be implemented with an N-type transistor. The configuration and operation of a driving circuit 144 shown in FIG. 2B are similar to those of the driving circuit 144 of FIG. 2A, except that connection positions of some components are changed due to a change in the type of transistors. Therefore, a detailed description of this will be omitted.

Figure 3:
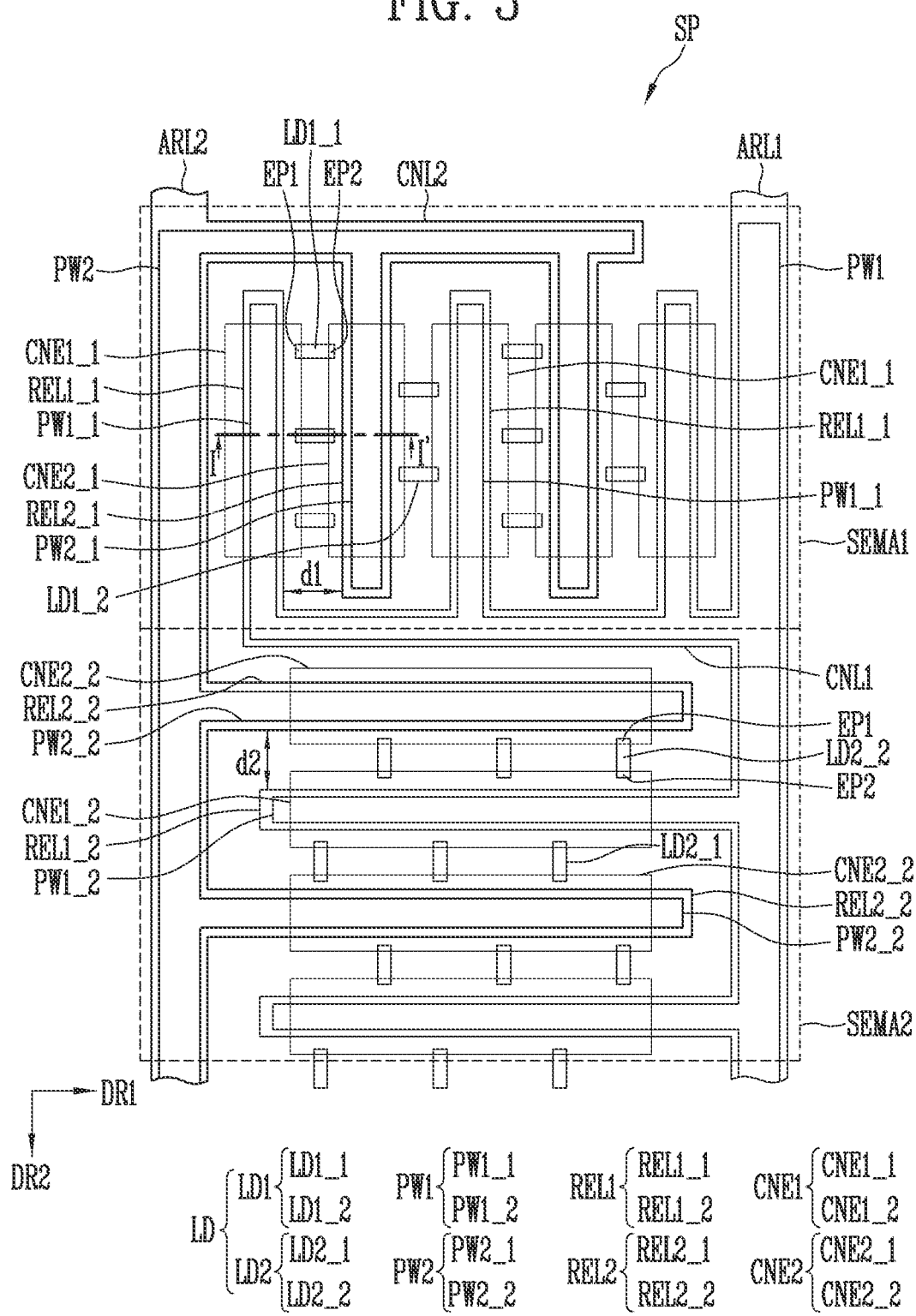
FIG. 3 is a plan view illustrating a unit light emitting region of a light emitting device including the LED of FIG. 1.
Figure 4:
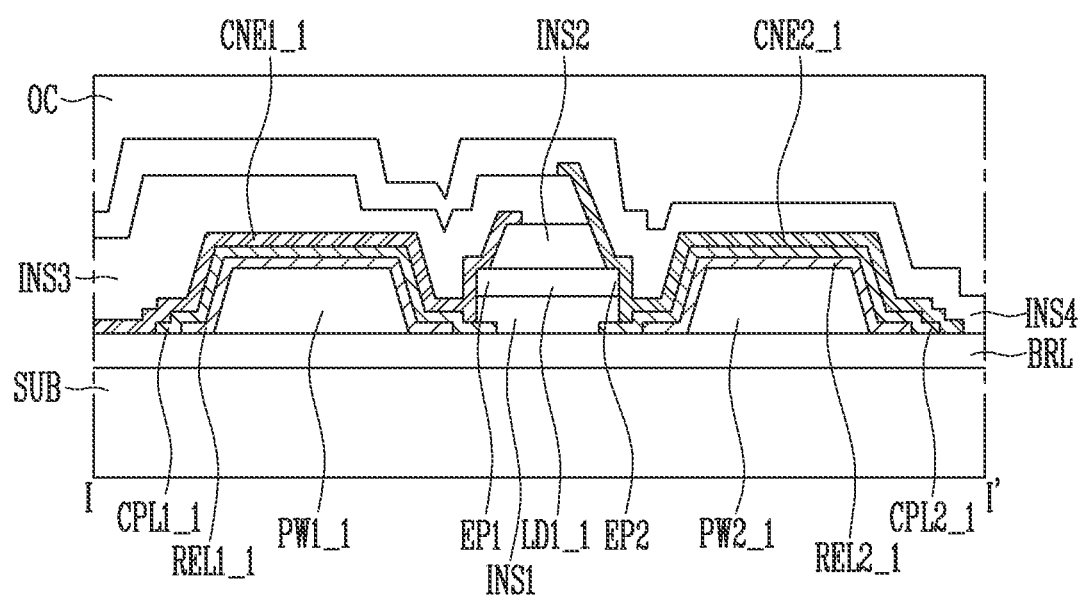
FIG. 4 is a sectional view taken along line I-I' of FIG. 3.

FIG. 3 is a plan view illustrating a unit light emitting region of a light emitting device including the bar type LED of FIG. 1. FIG. 4 is a sectional view taken along line I-I' of FIG. 3.

In FIG. 3, the unit light emitting region may be a pixel region of one sub-pixel included in a light emitting display panel.

Referring to FIGS. 1 to 4, the light emitting device according to the embodiment of the present invention may include a substrate SUB, a barrier layer BRL, a plurality of LEDs LD, first and second partition walls PW1 and PW2, first and second electrodes REL1 and REL2, first and second alignment lines ARL1 and ARL2, and first and second contact electrodes CNE1 and CNE2.

The substrate SUB may include an insulating material such as glass, organic polymer or quartz. Also, the substrate SUB may be made of a material having flexibility to be bendable or foldable, and have a single- or multi-layered structure.

The barrier layer BRL may prevent an impurity from being diffused into the LEDs LD.

Each of the LEDs LD may include a first conductive semiconductor layer 11, a second conductive semiconductor layer 13, and an active layer 12 interposed between the first and second conductive semiconductor layers 11 and 13. In some embodiments, each of the LEDs LD may further include an electrode layer (not shown) provided on the top of the second conductive semiconductor layer 13.

Each of the LEDs LD may include a first end portion EP1 and a second end portion EP2.

One of the first and second conductive semiconductor layers 11 and 13 may be disposed at the first end portion EP1, and the other of the first and second conductive semiconductor layers 11 and 13 may be disposed at the second end portion EP2. In an embodiment of the present invention, each LED LD may emit light of any one of colored light and/or white light.

A first insulating layer INS1 may be provided on the bottom of each of the LEDs LD.

The first insulating layer INS1 may fill a space between each of the LEDs LD and the substrate SUB, and stably support each of the LEDs LD, and prevent separation of each LED LD.

A second insulating layer INS2 covering a partial upper surface of each of the LEDs LD may be provided over the LEDs LD. Therefore, both the end portions EP1 and EP2 of each of the LEDs LD may be exposed to the outside.

The LEDs LD may include a first LED LD1 and a second LED LD2.

The first LED LD1 may include the first and second end portions EP1 and EP2 in a first direction DR1. The first direction DR1 may mean a horizontal direction when viewed on a plane or plan view.

The second LED LD2 may include the first and second end portions EP1 and EP2 in a second direction DR2 intersecting the first direction DR1. The second direction DR2 may mean a vertical direction when viewed on a plane.

In an embodiment of the present invention, the first LED LD1 may be aligned in the horizontal direction, and the second LED LD2 may be aligned in the vertical direction.

Each unit light emitting region of the light emitting device may include a first sub-light emitting region SEMA1 in which the LED LD1 is provided and a second sub-light emitting region SEMA2 in which the second LED LD2 is provided.

The first and second partition walls PW1 and PW2 may define the unit light emitting region in one sub-pixel SP.

The first and second partition walls PW1 and PW2 may be provided on the substrate SUB to be spaced apart from each other at a certain distance. The first and second partition walls PW1 and PW2 may be provided on the substrate SUB to spaced apart from each other at a distance equal to or larger than the length of one LED LD.

The first and second partition walls PW1 and PW2 may include an insulating material including an inorganic material or organic material, but the present invention is not limited thereto. The first and second partition walls PW1 and PW2 may have a trapezoidal shape of which side surfaces are inclined at a predetermined angle when viewed on a section. However, the present invention is not limited thereto, and the first and second partition walls PW1 and PW2 may have various shapes such as a semi-elliptical shape, a circular shape, and a quadrangular shape.

The first partition wall PW1 may include a (1-1)th partition wall PW1_1 provided in the first sub-light emitting region SEMA1 and a (1-2)th partition wall PW1_2 provided in the second sub-light emitting region SEMA2.

The second partition wall PW2 may include a (2-1)th partition wall PW2_1 provided in the first sub-light emitting region SEMA1 and a (2-2)th partition wall PW2_2 provided in the second sub-light emitting region SEMA2.

The (1-1)th partition wall PW1_1 and the (1-2)th partition wall PW1_2 may be integrally provided, and the (2-1)th partition wall PW2_1 and the (2-2)th partition wall PW2_2 may be integrally provided.

The (1-1)th partition wall PW1_1 and the (2-1)th partition wall PW2_1 may be provided on the substrate SUB of the first sub-light emitting region SEMA1 to be spaced apart from each other at a certain distance. The (1-1)th partition wall PW1_1 and the (2-1)th partition wall PW2_1 may extend along the second direction DR2 when viewed on a plane.

The (1-2)th partition wall PW1_2 and the (2-2)th partition wall PW2_2 may be provided on the substrate SUB of the second sub-light emitting region SEMA2 to be spaced apart from each other at a certain distance. The (1-2)th partition wall PW1_2 and the (2-2)th partition wall PW2_2 may extend along the first direction DR1 when viewed on a plane.

The (1-1)th partition wall PW1_1, the (1-2)th partition wall PW1_2, the (2-1)th partition wall PW2_1, and the (2-2)th partition wall PW2_2 may be disposed on the same plane on the substrate SUB, and have the same height.

The first electrode REL1 may be provided on the first partition wall PW1, and the second electrode REL2 may be provided on the second partition wall PW2.

The first electrode REL1 may be disposed adjacent to one of both the end portions EP1 and EP2 of a corresponding LED LD, and the second electrode REL2 may be disposed adjacent to the other of both the end portions EP1 and EP2 of the corresponding LED LD.

The first electrode REL1 may be electrically connected to the corresponding the LED LD through the first contact electrode CNE1, and the second electrode REL2 may be electrically connected to the corresponding LED LD through the second contact electrode CNE2.

The first electrode REL1 may include a (1-1)th electrode REL1_1 provided on the (1-1)th partition wall PW1_1 and a (1-2)th electrode REL1_2 provided on the (1-2)th partition wall PW1_2.

The (1-1)th electrode REL1_1 may be provided in the first sub-light emitting region SEMA1, and overlap with the (1-1)th partition wall PW1_1 when viewed on a plane. The (1-1)th electrode REL1_1 may extend in the second direction DR2 in the first sub-light emitting region SEMA1.

The (1-1)th electrode REL1_1 may branch off in the second direction DR2 from a first connection line CNL1 extending along the first direction DR1 to be provided in plurality in the first sub-light emitting region SEMA1.

The first connection line CNL1 may be connected to the first alignment line ARL1. The first connection line CNL1 may be integrally provided with the first alignment line ARL1, but the present invention is not limited thereto.

The (1-2)th electrode REL1_2 may be provided in the second sub-light emitting region SEMA, and overlap with the (1-2)th partition wall PW1_2 when viewed on a plane. The (1-2)th electrode REL1_2 may extend in the first direction DR1 in the second sub-light emitting region SEMA2.

The (1-2)th electrode REL1_2 may branch off in the first direction DR1 from the first alignment line ARL1 extending along the second direction DR2 to be provided in plurality in the second sub-light emitting region SEMA2.

A (1-1)th capping layer CPL1_1 made of a transparent conductive material such as IZO may be provided on the (1-1)th electrode REL1_1. The (1-1)th capping layer CPL1_1 may prevent damage of the (1-1)th electrode REL1_1 due to a failure or the like, which occurs in a fabricating process of the light emitting device, and further reinforce adhesion between the (1-1)th electrode REL1_1 and the substrate SUB.

A (1-2)th capping layer (not shown) including the same material as the (1-1)th capping layer CPL1_1 may also be provided on the (1-2)th electrode REL1_2.

The second electrode REL2 may include a (2-1)th electrode REL2_1 provided on the (2-1)th partition wall PW2_1 and a (2-2)th electrode REL2_2 provided on the (2-2)th partition wall PW2_2.

The (2-1)th electrode REL2_1 may be provided in the first sub-light emitting region SEMA1, and overlap with the (2-1)th partition wall PW2_1 when viewed on a plane. The (2-1)th electrode REL2_1 may extend in the second direction DR2 in the first sub-light emitting region SEMA1.

The (2-1)th electrode REL2_1 may branch off in the second direction DR2 from a second connection line CNL2 extending along the first direction DR1 to be provided in plurality in the first sub-light emitting region SEMA1.

The second connection line CNL2 may be connected to the second alignment line ARL2. The second connection line CNL2 may be integrally provided with the second alignment line ARL2, but the present invention is not limited thereto.

The (2-2)th electrode REL2_2 may be provided in the second sub-light emitting region SEMA2, and overlap with the (2-2)th partition wall PW2_2 when viewed on a plane.

The (2-2)th electrode REL2_2 may extend in the first direction DR1 in the second sub-light emitting region SEMA2.

The (2-2)th electrode REL2_2 may branch off in the first direction DR1 from the second alignment line ARL2 extending along the second direction DR2 to be provided in plurality in the second sub-light emitting region SEMA2.

A (2-1)th capping layer CPL2_1 made of a transparent conductive material such as IZO may be provided on the (2-1)th electrode REL2_1. A (2-2)th capping layer (not shown) including the same material as the (2-1)th capping layer CPL2_1 may also be provided on the (2-2)th electrode REL2_2.

When viewed on a plane, the (1-1)th and (2-1)th electrodes REL1_1 and REL2_1 may be alternately provided along the first direction DR1 in the first sub-light emitting region SEMA1.

Also, when viewed on a plane, the (1-2)th and (2-2)th electrodes REL1_2 and REL2_2 may be alternately provided along the second direction DR2 in the second sub-light emitting region SEMA2.

A distance d1 between the (1-1)th and (2-1)th electrodes REL1_1 and REL2_1 in the first sub-light emitting region SEMA1 and a distance d2 between the (1-2)th and (2-2)th electrodes REL1_2 and REL2_2 in the second sub-light emitting region SEMA2 may be designed to be the same.

This is for the purpose that the first LED LD1 aligned in the first sub-light emitting region SEMA1 and the second LED LD2 aligned in the second sub-light emitting region SEMA2 have the same alignment area.

When the alignment areas in the first and second sub-light emitting regions SEMA1 and SEMA2 are the same, the first and second LEDs LD1 and LD2 can be prevented from being biased to a partial region.

The first and second electrodes REL1 and REL2 may be provided to correspond to the shapes of the first and second partition walls PW1 and PW2. Therefore, the first electrode REL1 may have a slope corresponding to the gradient of the first partition wall PW1, and the second electrode REL2 may have a slope corresponding to the gradient of the second partition wall PW2.

In an embodiment of the present invention, the first and second electrodes REL1 and REL2 may be made of a conductive material having a constant reflexibility. The first and second electrodes REL1 and REL2 may allow lights emitted from both the end portions EP1 and EP2 of a corresponding LED LD to advance in a direction (e.g., a front direction) in which an image is displayed.

Any one of the first and second electrodes REL1 and REL2 may be an anode electrode, and the other of the first and second electrodes REL1 and REL2 may be a cathode electrode. In an embodiment of the present invention, the first electrode REL1 may be the anode electrode, and the second electrode REL2 may be the cathode electrode.

The first electrode REL1 and the second electrode REL2 may be disposed on the same plane, and have the same height.

Although a case where the first and second electrodes REL1 and REL2 are provided directly on the substrate SUB is illustrated for convenience of description, the present invention is not limited thereto. For example, a component for driving the light emitting device in a passive matrix manner or active matrix manner may further provided between the first and second electrodes REL1 and REL2 and the substrate SUB.

The first alignment line ARL1 may extend along the second direction DR2 in the unit light emitting region, and be electrically connected to the first electrode REL1. When viewed on a plane, the first alignment line ARL1 may overlap with the first partition wall PW1.

The second alignment line ARL2 may be spaced apart from the first alignment line ARL1 at a certain distance in the unit light emitting region, and be electrically connected to the second electrode REL2. When viewed on a plane, the second alignment line ARL2 may overlap with the second partition wall PW2.

In an embodiment of the present invention, the first and second alignment lines ARL1 and ARL2 may be disposed in the same layer as the first and second electrode REL1 and REL2, but the present invention is not limited thereto. For example, each of the first and second alignment lines ARL1 and ARL2 may be provided in a layer different from that of the first and second electrodes REL1 and REL2 to be electrically connected to a corresponding electrode through a contact hole or the like.

A first alignment voltage may be applied to the first alignment line ARL1, and a second alignment voltage having a voltage level different from that of the first alignment voltage may be applied to the second alignment line ARL2.

The first alignment line ARL1 may transfer the first alignment voltage to the first electrode REL1 such that the LEDs LD are aligned in the one sub-pixel SP. The second alignment line AR2 may transfer the second alignment voltage to the second electrode REL2 such that the LEDs LD are aligned in the one sub-pixel SP.

In an embodiment of the present invention, a ground voltage GND may be applied as the first alignment voltage to the first alignment line ARL1, and an AC voltage may be applied as the second alignment voltage to the second alignment line ARL2.

When predetermined voltages having different voltage levels are respectively applied to the first alignment line ARL1 and the second alignment line ARL2, an electric field may be formed between the first electrode REL1 and the second electrode REL2.

The first and second electrodes REL1 and REL2, the first and second alignment lines ARL1 and ARL2, and the first and second connection lines CNL1 and CNL2 may be made of a conductive material. The conductive material may include a metal such as Ag, Mg, Al, Pt, Pd, Au, Ni, Nd, Ir, Cr, or any alloy thereof, a conductive oxide such as indium tin oxide (ITO), indium zinc oxide (IZO), zinc oxide (ZnO), or indium tin zinc oxide (ITZO), a conductive polymer such as PEDOT, and the like.

Also, the first and second electrodes REL1 and REL2, the first and second alignment lines ARL1 and ARL2, and the first and second connection lines CNL1 and CNL2 may be formed in a single layer. However, the present invention is not limited thereto, and the first and second electrodes REL1 and REL2, the first and second alignment lines ARL1 and ARL2, and the first and second connection lines CNL1 and CNL2 may be formed in a multi-layer in which two or more materials among metals, alloys, conductive oxides, and conductive polymers are stacked.

In the first sub-light emitting region SEMA1, the first LED LD1 may be provided between the (1-1)th electrode REL1_1 and the (2-1)th electrode REL2_1.

Any one of both the end portions EP1 and EP2 of the first LED LD1 may be connected to the (1-1)th electrode REL1_1, and the other of both the end portions EP1 and EP2 of the first LED LD1 may be connected to the (2-1)th electrode REL2_1.

For example, the first end portion EP1 of the first LED LD1 may be connected to the (1-1)th electrode REL1_1, and the second end portion EP2 of the first LED LD1 may be connected to the (2-1)th electrode REL2_1. Also, the first end portion EP1 of the first LED LD1 may be connected to the (2-1)th electrode REL2_1, and the second end portion EP2 of the first LED LD1 may be connected to the (1-1)th electrode REL1_1.

Hereinafter, for convenience, the first LED LD1 having the first end portion EP1 connected to the (1-1)th electrode REL1_1 is described as a (1-1)th LED LD1_1. In addition, the first LED LD1 having the first end portion EP1 connected to the (2-1)th electrode REL2_1 is described as a (1-2)th LED LD1_2.

In the second sub-light emitting region SEMA2, the second LED LD2 may be provided between the (1-2)th electrode REL1_2 and the (2-2)th electrode REL2_2.

Any one of both the end portions EP1 and EP2 of the second LED LD2 may be connected to the (1-2)th electrode REL1_2, and the other of both the end portions EP1 and EP2 of the second LED LD2 may be connected to the (2-2)th electrode REL2_2.

For example, the first end portion EP1 of the second LED LD2 may be connected to the (1-2)th electrode REL1_2, and the second end portion EP2 of the second LED LD2 may be connected to the (2-2)th electrode REL2_2. Also, the first end portion EP1 of the second LED LD2 may be connected to the (2-2)th electrode REL2_2, and the second end portion EP2 of the second LED LD2 may be connected to the (1-2)th electrode REL1_2.

Hereinafter, for convenience, the second LED LD2 having the first end portion EP1 connected to the (1-2)th electrode REL1_2 is described as a (2-1)th LED LD2_1. In addition, the second LED LD2 having the first end portion EP1 connected to the (2-2)th electrode REL2_2 is described as a (2-2)th LED LD2_2.

The first contact electrode CNE1 may be disposed on the first electrode REL1.

When viewed on a plane, the first contact electrode CNE1 may cover the first electrode REL1 and overlap with the first electrode REL1. Also, the first contact electrode CNE1 may partially overlap with one of both the end portions EP1 and EP2 of each LED LD.

The first contact electrode CNE1 may include a (1-1)th contact electrode CNE1_1 disposed on the (1-1)th electrode REL1_1 and a (1-2)th contact electrode CNE1_2 disposed on the (1-2)th electrode REL1_2.

The (1-1)th contact electrode CNE1_1 may be provided in the first sub-light emitting region SEMA1, and the (1-2)th contact electrode CNE1_2 may be provided in the second sub-light emitting region SEMA2.

When viewed on a plane, the (1-1)th contact electrode CNE1_1 may overlap with the (1-1)th electrode REL1_1 and the first end portion EP1 of the (1-1)th LED LD1_1. Also, the (1-1)th contact electrode CNE1_1 may also overlap with the second end portion EP2 of the (1-2)th LED LD1_2.

When viewed on a plane, the (1-2)th contact electrode CNE1_2 may overlap with the second end portion EP2 of each of the (2-2)th LEDs LD2_2 and the (1-2)th electrode REL1_2. Also, when viewed on a plane, the (1-2)th contact electrode CNE1_2 may overlap with the first end portion EP1 of each of the (2-1)th LEDs LD2_1.

A third insulating layer IN3 cover the first contact electrode CNE1 may be provided over the first contact electrode CNE1. The third insulating layer INS3 allows the first contact electrode CNE1 not to be exposed to the outside, so that corrosion of the first contact electrode CNE1 can be prevented.

The third insulating layer INS3 may be an inorganic insulating layer including an inorganic material or an organic insulating layer including an organic material. The third insulating layer INS3 may be provided in a single layer as shown in the drawings. However, the present invention is not limited thereto, and the third insulating layer INS3 may be provided in a multi-layer.

The second contact electrode CNE2 may be provided on the second electrode REL2.

When viewed on a plane, the second contact electrode CNE2 may cover the second electrode REL2 and overlap with the second electrode REL2. Also, the second contact electrode CNE2 may partially overlap with one of both end portions EP1 and EP2 of each LED LD.

In an embodiment of the present invention, the second contact electrode CNE2 may include a (2-1)th contact electrode CNE2_1 provided on the (2-1)th electrode REL2_1 and a (2-2)th contact electrode CNE2_2 provided on the (2-2)th electrode REL2_2.

The (2-1)th contact electrode CNE2_1 may be provided in the first sub-light emitting region SEMA1, and the (2-2)th contact electrode CNE2_2 may be provided in the second sub-light emitting region SEMA2.

When viewed on a plane, the (2-1)th contact electrode CNE2_1 may overlap with the second end portion EP2 of each of the (1-1)th LEDs LD1_1 and the (2-1)th electrode REL2_1. Also, the (2-1)th contact electrode CNE2_1 may overlap with the first end portion EP1 of each of the (1-2)th LEDs LD1_2.

When viewed on a plane, the (2-2)th contact electrode CNE2_2 may overlap with the first end portion EP1 of the (2-2)th LED LD2_2 and the (2-2)th electrode REL2_2. Also, the (2-2)th contact electrode CNE2_2 may overlap with the second end portion EP2 of the (2-1)th LED LD2_1.

The second contact electrode CNE2 may be made of the same material as the first contact electrode CNE1, but the present invention is not limited thereto.

A fourth insulating layer INS4 covering the second contact electrode CNE2 may be provided over the second contact electrode CNE2.

The fourth insulating layer INS4 allows the second contact electrode CNE2 not to be exposed to the outside, so that corrosion of the second contact electrode CNE2 can be prevented. The fourth insulating layer INS4 may be configured as any one of an inorganic insulating layer and an organic insulating layer.

An overcoat layer OC may be provided on the fourth insulating layer INS4.

The overcoat layer OC may be a planarization layer for reducing a step difference generated by the first and second partition walls PW1 and PW2, the first and second electrodes REL1 and REL2, the first and second contact electrodes CNE1 and CNE2, and the like, which are disposed on the bottom thereof. Also, the overcoat layer OC may be an encapsulation layer for preventing oxygen, moisture, and the like from penetrating into the LEDs LD.

As described above, the (1-1)th and (2-1)th electrodes REL1_1 and REL2_1 extend along the second direction DR2 in the first sub-light emitting region SEMA1, and therefore, the first LED LD1 may be aligned in the first direction DR1.

When an electric field having a predetermined voltage or more is applied to both the end portions EP1 and EP2 of each of the first LEDs LD1 through the (1-1)th and (2-1)th electrodes REL1_1 and REL2_1, the first LEDs LD1 emit lights when electron-hole pairs are combined in the active layer 12.

The light emitted from each of the first LEDs LD1 may advance in the length direction of each of the first LEDs LD1, i.e., the first direction DR1. The light advancing in the first direction DR1 may be reflected by the (1-1)th and (2-1)th electrodes REL1_1 and REL2_1 to advance in the front direction.

Since the (1-2)th and (2-2)th electrodes REL1_2 and REL2_2 extend along the first direction DR1 in the second sub-light emitting region SEMA2, each of the second LEDs LD2 may be aligned in the second direction DR2.

When an electric field having a predetermined voltage or more is applied to both the end portions EP1 and EP2 of each of the second LEDs LD2 through the (1-2)th and (2-2)th electrodes REL1_2 and REL2_2, the second LEDs LD2 emit lights when electron-hole pairs are combined in the active layer 12.

The light emitted from the second LED LD2 may advance in the length direction of the second LED LD2, i.e., the second direction DR2. The light advancing in the second direction DR2 may be reflected by the (1-2)th and (2-2)th electrodes REL1_2 and REL2_2 to advance in the front direction.

In an embodiment of the present invention, the first and second LEDs LD1 and LD2 are aligned in different directions in the one sub-pixel SP, and thus lights respectively emitted from the first and second LEDs LD1 and LD2 are not concentrated in a specific direction. Accordingly, the light emitting device can have a uniform light output distribution throughout the entire region.

In the existing light emitting device, when the first and second LEDs LD1 and LD2 are aligned in the same direction e.g., a horizontal direction in the one sub-pixel SP, light emitted from each of the first and second LEDs LD1 and LD2 may advance in the horizontal direction. The light may be concentrated along the alignment direction of the first and second LEDs LD1 and LD2.

When the light is concentrated in a specific direction in the one sub-pixel SP, the light output efficiency of the light may be changed depending on regions of the existing light emitting device. The difference in the light output efficiency of the light depending on the regions may cause an image quality failure in a display device employing the existing light emitting device as a light source.

Accordingly, in the light emitting device according to the embodiment of the present invention, the first and second LEDs LD1 and LD2 are aligned in different directions, so that light emitted from each of the first and second LEDs LD1 and LD2 is not concentrated in a specific direction in the one sub-pixel SP.

Figure 5:
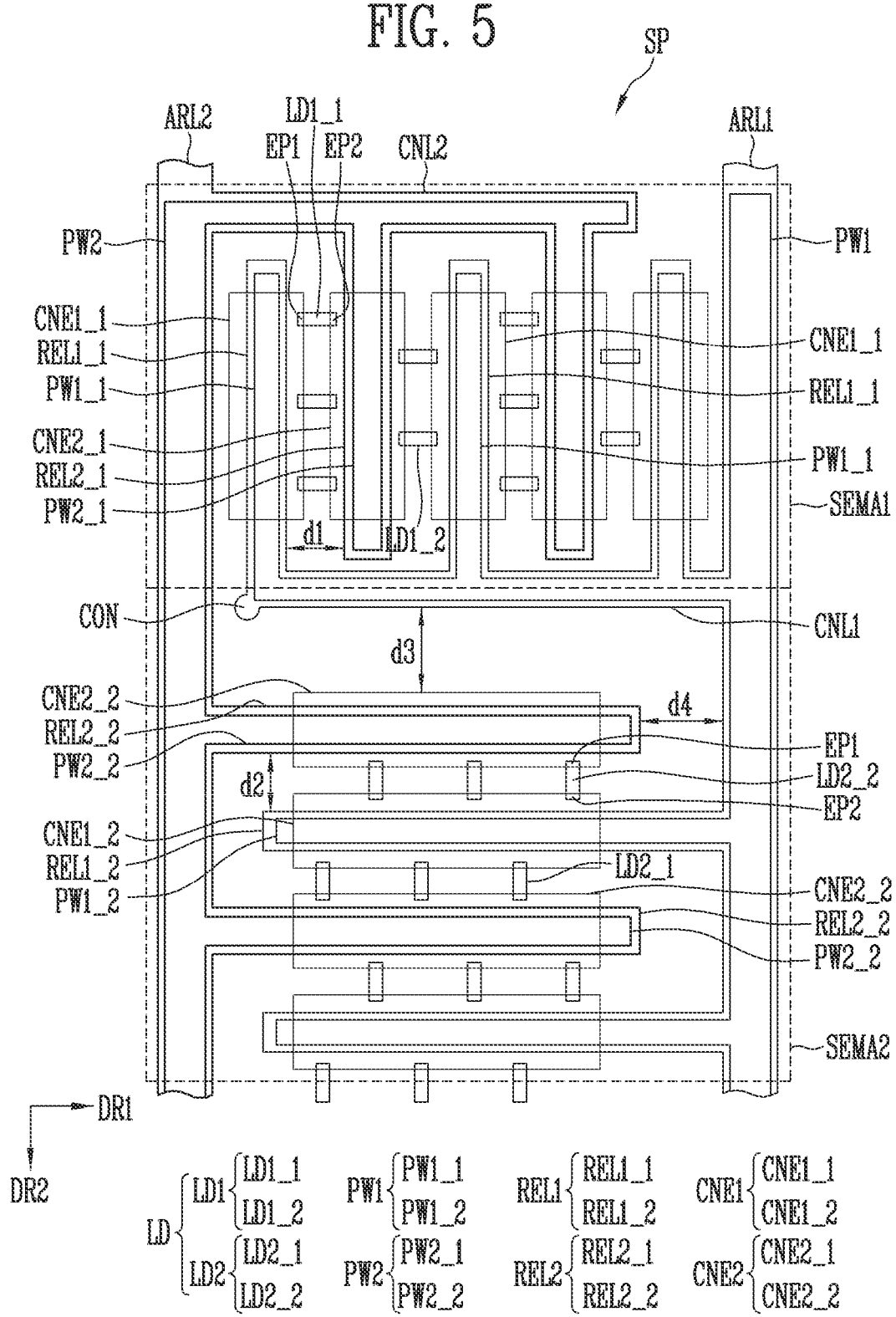
FIG. 5 is a plan view illustrating another embodiment of the unit light emitting region of the light emitting device of FIG. 3.

FIG. 5 is a plan view illustrating another embodiment of the unit light emitting region of the light emitting device of FIG. 3. In this embodiment, portions different from those of the above-described embodiment will be mainly described to avoid redundancy. Portions not particularly described in this embodiment follow those of the above-described embodiment. In addition, identical reference numerals refer to identical components, and similar reference numerals refer to similar components.

The light emitting device shown in FIG. 5 may have a configuration substantially identical or similar to that of the light emitting device of FIG. 3, except that one end portion of a first connection line is formed in a round shape, and a distance between the first connection line and an electrode disposed at an uppermost side of a second sub-light emitting region is adjusted.

Referring to FIG. 5, the light emitting device according to the another embodiment of the present invention may include a substrate SUB including a plurality of unit light emitting regions, a barrier layer BRL, a plurality of LEDs LD, first and second partition walls PW1 and PW2, first and second electrodes REL1 and REL2, first and second alignment lines ARL1 and ARL2, and first and second contact electrodes CNE1 and CNE2.

The first electrode REL1 may include a (1-1)th electrode REL1_1 extending along a second direction DR2 and a (1-2)th electrode REL1_2 extending along a first direction DR1 intersecting the second direction DR2.

The second electrode REL2 may include a (2-1)th electrode REL2_1 extending along the second direction DR2 and a (2-2)th electrode REL2_2 extending along the first direction DR1.

The LEDs LD may include a first LED LD1 aligned between the (1-1)th electrode REL1_1 and the (2-1)th electrode REL2_1 and a second LED LD2 aligned between the (1-2)th electrode REL1_2 and the (2-2)th electrode REL2_2.

In an embodiment of the present invention, the first LED LD1 may be aligned along the first direction DR1, and include first and second end portions EP1 and EP2 in the first direction DR1. In addition, the second LED LD2 may be aligned along the second direction DR2, and include first and second end portions EP1 and EP2 in the second direction DR2.

Each unit light emitting region may include a first sub-light emitting region SEMA1 in which the first LED LD1 is provided and a second sub-light emitting region SEMA2 in which the second LED LD2 is provided.

The (1-1)th and (2-1)th electrodes REL1_1 and REL2_1 may be provided in the first sub-light emitting region SEMA1, and the (1-2)th and (2-2)th electrodes REL1_2 and REL2_2 may be provided in the second sub-light emitting region SEMA2.

A first connection line CNL1 extending in the first direction DR1 may be provided in each unit light emitting region.

The first connection line CNL1 may include one end portion connected to the first alignment line ARL1 and the other end portion CON opposite to the one end portion. The other end portion CON of the first connection line CNL1 may have a round shape.

When the first and second LEDs LD1 and LD2 are aligned in a corresponding sub-light emitting region, an electric field may be concentrated between the second alignment line ARL2 and the other end portion of the first connection line CNL1 (hereinafter, referred to as a 'first region'). When the electric field is concentrated in the first region, the LEDs LD may be biased and aligned in the first region.

In order to prevent the LED LD from being biased to a partial region, in an embodiment of the present invention, the other end portion CON of the first connection line CNL1 may be designed in a round shape, so that the electric field concentrated in the first region can be dispersed.

Also, in an embodiment of the present invention, a distance d3 between one electrode disposed at an uppermost side in the second sub-light emitting region SEMA2 and the first connection line CNL1 may be designed larger than a distance d2 between the (1-2)th and (2-2)th electrodes REL1_2 and REL2_2.

This is for the purpose of preventing an electric field from being concentrated between the one electrode disposed at the uppermost side in the second sub-light emitting region SEMA2 and the first connection line CNL1.

Additionally, in an embodiment of the present invention, a distance d4 between each of the (2-2)th electrodes REL2_2 and the first alignment line ARL1 may be designed larger than the distance d2 between the (1-2)th and (2-2)th electrodes REL1_2 and REL2_2.

Figure 6:
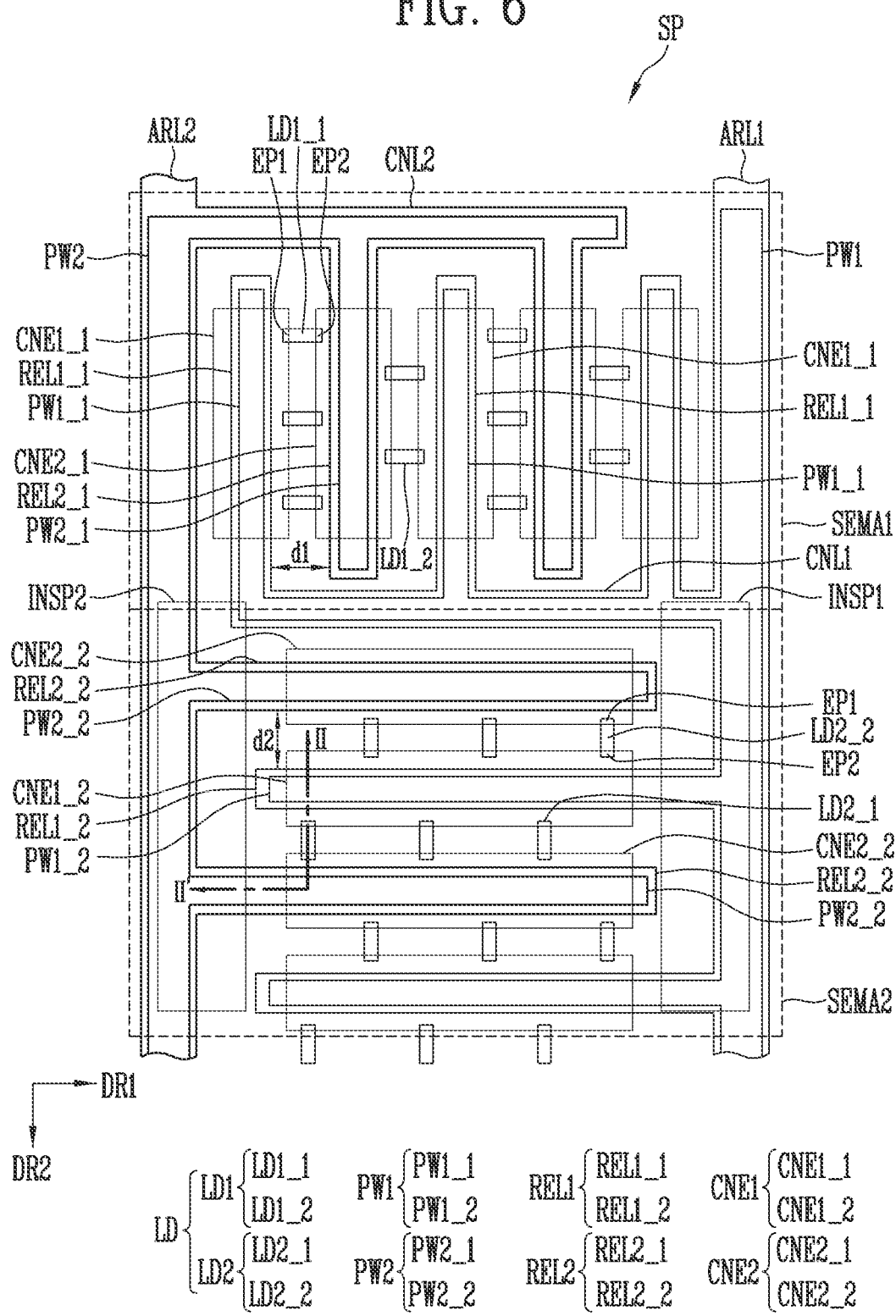
FIG. 6 is a plan view illustrating another embodiment of the unit light emitting region of the light emitting device of FIG. 3.
Figure 7:
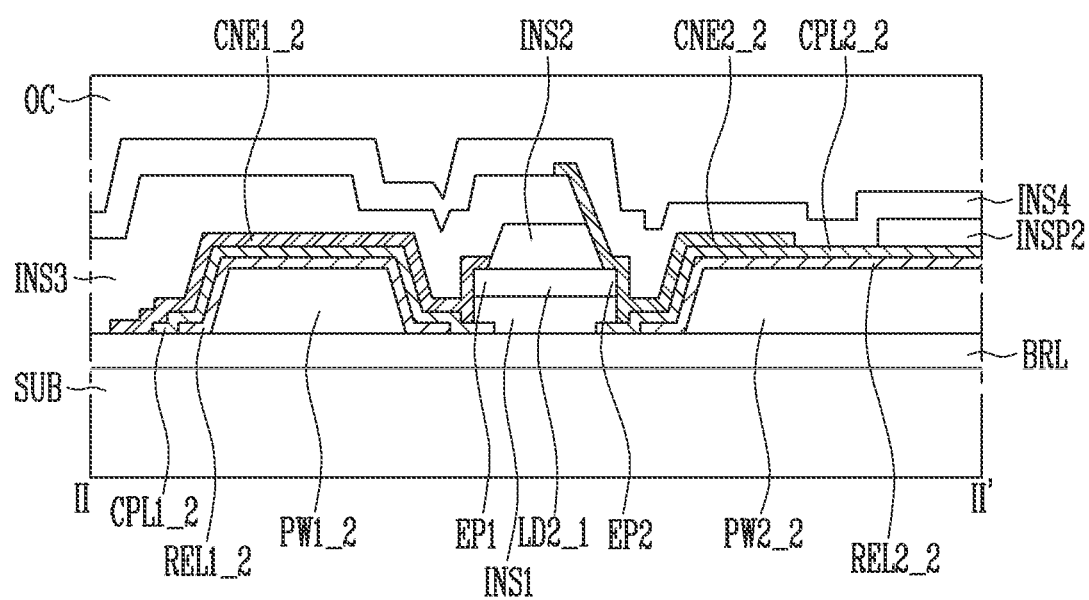
FIG. 7 is a sectional view taken along line II-II' of FIG. 6.

FIG. 6 is a plan view illustrating another embodiment of the unit light emitting region of the light emitting device of FIG. 3. FIG. 7 is a sectional view taken along line II-II' of FIG. 6. In this embodiment, portions different from those of the above-described embodiment will be mainly described to avoid redundancy. Portions not particularly described in this embodiment follow those of the above-described embodiment. In addition, identical reference numerals refer to identical components, and similar reference numerals refer to similar components.

The light emitting device shown in FIGS. 6 and 7 may have a configuration substantially identical or similar to that of the light emitting device of FIG. 3, except that the light emitting device shown in FIGS. 6 and 7 includes a first insulating pattern overlapping with a first alignment line and a second insulating pattern overlapping with a second alignment line.

Referring to FIGS. 6 and 7, the light emitting device according to the another embodiment of the present invention may include a substrate SUB including a plurality of unit light emitting regions, a barrier layer BRL, a plurality of LEDs LD, first and second partition walls PW1 and PW2, first and second electrodes REL1 and REL2, first and second alignment lines ARL1 and ARL2, and first and second contact electrodes CNE1 and CNE2.

The first electrode REL1 may include a (1-1)th electrode REL1_1 extending along a second direction DR2 and a (1-2)th electrode REL1_2 extending along a first direction DR1 intersecting the second direction DR2.

The second electrode REL2 may include a (2-1)th electrode REL2_1 extending along the second direction DR2 and a (2-2)th electrode REL2_2 extending along the first direction DR1.

The LEDs LD may include a first LED LD1 aligned between the (1-1)th electrode REL1_1 and the (2-1)th electrode REL2_1 and a second LED LD2 aligned between the (1-2)th electrode REL1_2 and the (2-2)th electrode REL2_2.

Each unit light emitting region may include a first sub-light emitting region SEMA1 in which the first LED LD1 is provided and a second sub-light emitting region SEMA2 in which the second LED LD2 is provided.

The light emitting device may further include first and second insulating patterns INSP1 and INSP2 provided in each unit light emitting region.

The first and second insulating patterns INSP1 and INSP2 may be disposed to correspond to a region in which an electric field is concentrated when the LEDs LD are aligned in each unit light emitting region.

The first and second insulating patterns INSP1 and INSP2 may partially shield the electric field in the region in which the electric field is concentrated. Accordingly, the LEDs LD can be prevented from being biased to the region in which the electric field is concentrated.

The region in which the electric field is concentrated may be, for example, between the first alignment line ARL1 and the (1-2)th electrode REL1_2 and between the second alignment line ARL2 and the (2-2)th electrode REL2_2.

When viewed on a plane, the first insulating pattern INSP1 may be provided to overlap the first alignment line ARL1 and the (1-2)th electrode REL1_2, and the second insulating pattern INSP2 may be provided to overlap with the second alignment line ARL2 and the (2-2)th electrode REL2_2.

The first insulating pattern INSP1 may extend along the extending direction of the first alignment line ARL1, and the second insulating pattern INSP2 may extend along the extending direction of the second alignment line ARL2.

The first and second insulating patterns INSP1 and INSP2 may be provided in the same layer as a first insulating layer INS1 disposed on the bottom of each of the LEDs LD, and include the same material.

The first and second insulating patterns INSP1 and INSP2 and the first insulating layer INS1 may be configured as any one of an inorganic insulating layer including an inorganic material and an organic insulating layer including an organic material.

In an embodiment of the present invention, the first and second insulating patterns INSP1 and INSP2 may be provided in a bar shape extending in the second direction DR2, but the present invention is not limited thereto. The first and second insulating patterns INSP1 and INSP2 may be provided in various shapes within a range where the first and second insulating patterns INSP1 and INSP2 are disposed in the region in which the electric field is concentrated, to shield the electric field.

Figure 8:
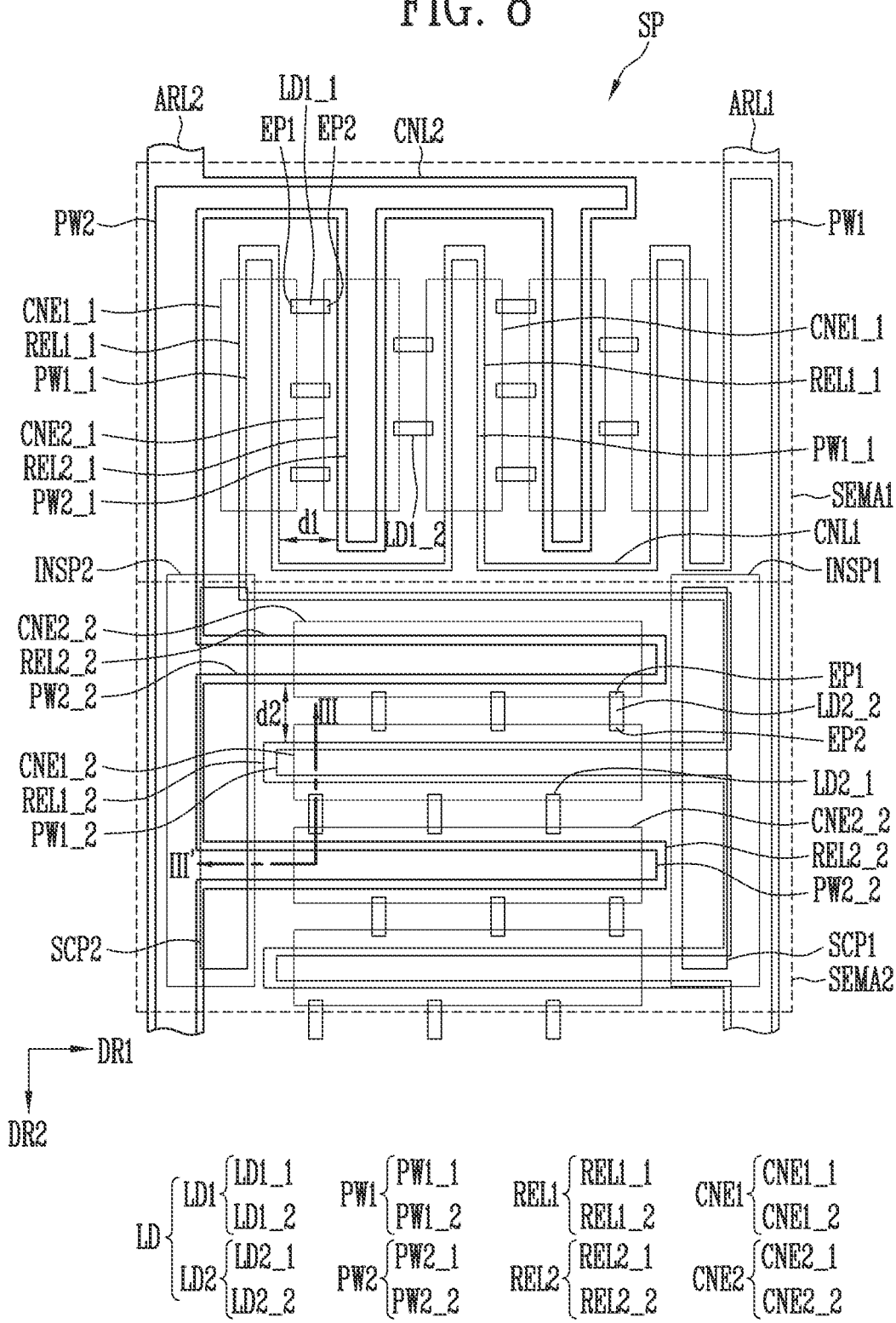
FIG. 8 is a plan view illustrating another embodiment of the unit light emitting region of the light emitting device of FIG. 3.
Figure 9:
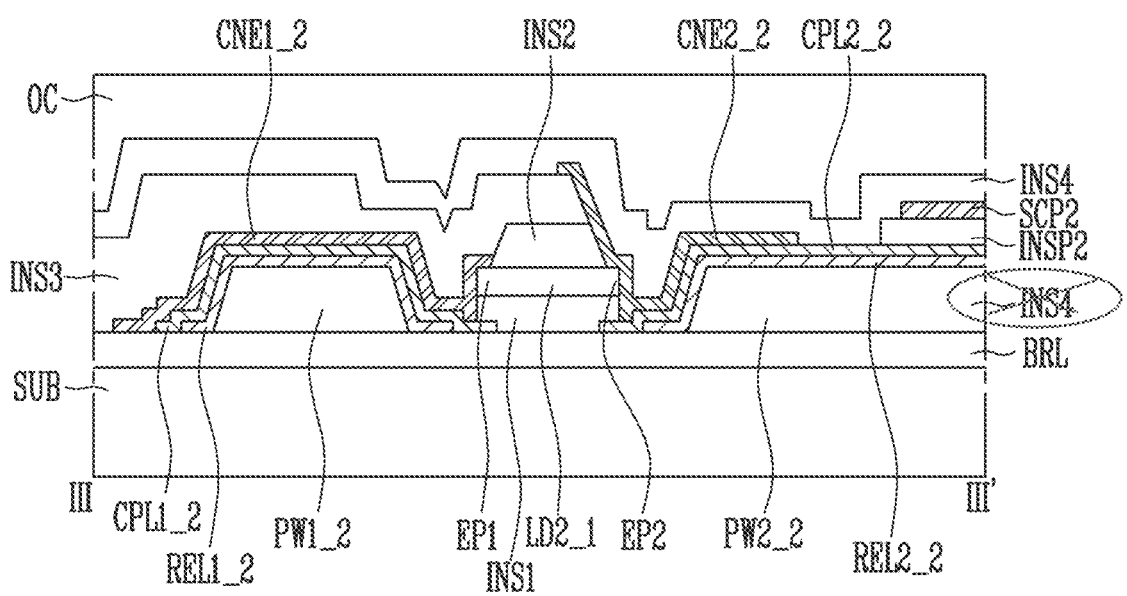
FIG. 9 is a sectional view taken along line III-III' of FIG. 8.

FIG. 8 is a plan view illustrating another embodiment of the unit light emitting region of the light emitting device of FIG. 3. FIG. 9 is a sectional view taken along line III-III' of FIG. 8. In this embodiment, portions different from those of the above-described embodiment will be mainly described to avoid redundancy. Portions not particularly described in this embodiment follow those of the above-described embodiment. In addition, identical reference numerals refer to identical components, and similar reference numerals refer to similar components.

The light emitting device shown in FIGS. 8 and 9 may have a configuration substantially identical or similar to that of the light emitting device of FIG. 6, except that a first shielding conductive pattern is provided on a first insulating pattern and a second shielding conductive pattern is provided on a second insulating pattern.

Referring to FIGS. 8 and 9, the light emitting device according to the another embodiment of the present invention may include a substrate SUB including a plurality of unit light emitting regions, a barrier layer BRL, a plurality of LEDs LD, first and second partition walls PW1 and PW2, first and second electrodes REL1 and REL2, first and second alignment lines ARL1 and ARL2, and first and second contact electrodes CNE1 and CNE2.

The first electrode REL1 may include a (1-1)th electrode REL1_1 extending along a second direction DR2 and a (1-2)th electrode REL1_2 extending along a first direction DR1 intersecting the second direction DR2.

The second electrode REL2 may include a (2-1)th electrode REL2_1 extending along the second direction DR2 and a (2-2)th electrode REL2_2 extending along the first direction DR1.

The LEDs LD may include a first LED LD1 aligned between the (1-1)th electrode REL1_1 and the (2-1)th electrode REL2_1 and a second LED LD2 aligned between the (1-2)th electrode REL1_2 and the (2-2)th electrode REL2_2.

Each unit light emitting region may include a first sub-light emitting region SEMA1 in which the first LED LD1 is provided and a second sub-light emitting region SEMA2 in which the second LED LD2 is provided.

The light emitting device may further include first and second insulating patterns INSP1 and INSP2 and first and second shielding conductive patterns SCP1 and SCP2, which are provided in each unit light emitting region.

The first and second insulating patterns INSP1 and INSP2 may be disposed to correspond to a region in which an electric field is concentrated when the LEDs LD are aligned in each unit light emitting region.

The first and second insulating patterns INSP1 and INSP2 may partially shield the electric field in the region in which the electric field is concentrated. Accordingly, the LEDs LD can be prevented from being biased to the region in which the electric field is concentrated.

Each of the first and second shielding conductive patterns SCP1 and SCP2 may be provided on any one of the first and second insulating patterns INSP and INSP2 to further shield the electric field in the region in which the electric field is concentrated.

For example, the first shielding conductive pattern SCP1 may be provided on the first insulating pattern INSP1, and the second shielding conductive pattern SCP2 may be provided on the second insulating pattern INSP2.

When viewed on a plane, the first shielding conductive pattern SCP1 may extend along the extending direction of the first insulating pattern INSP1 and overlap with the first insulating pattern INSP1. When viewed on a plane, the second shielding conductive pattern SCP2 may extend along the extending direction of the second insulating pattern INSP2 and overlap with the second insulating pattern INSP2.

In an embodiment of the present invention, the first and second shielding conductive patterns SCP1 and SCP2 may be provided in the same layer as the first contact electrode CNE1, and include the same material.

The first and second shielding conductive patterns SCP1 and SCP2 may be made of a transparent conductive material to minimize loss of light emitted from each of the first and second LEDs LD1 and LD2.

The first and second shielding conductive patterns SCP1 and SCP2 may be provided in various shapes within a range where the first and second shielding conductive patterns SCP1 and SCP2 are disposed in the region in which the electric field is concentrated, to shield the electric field.

Figure 10:
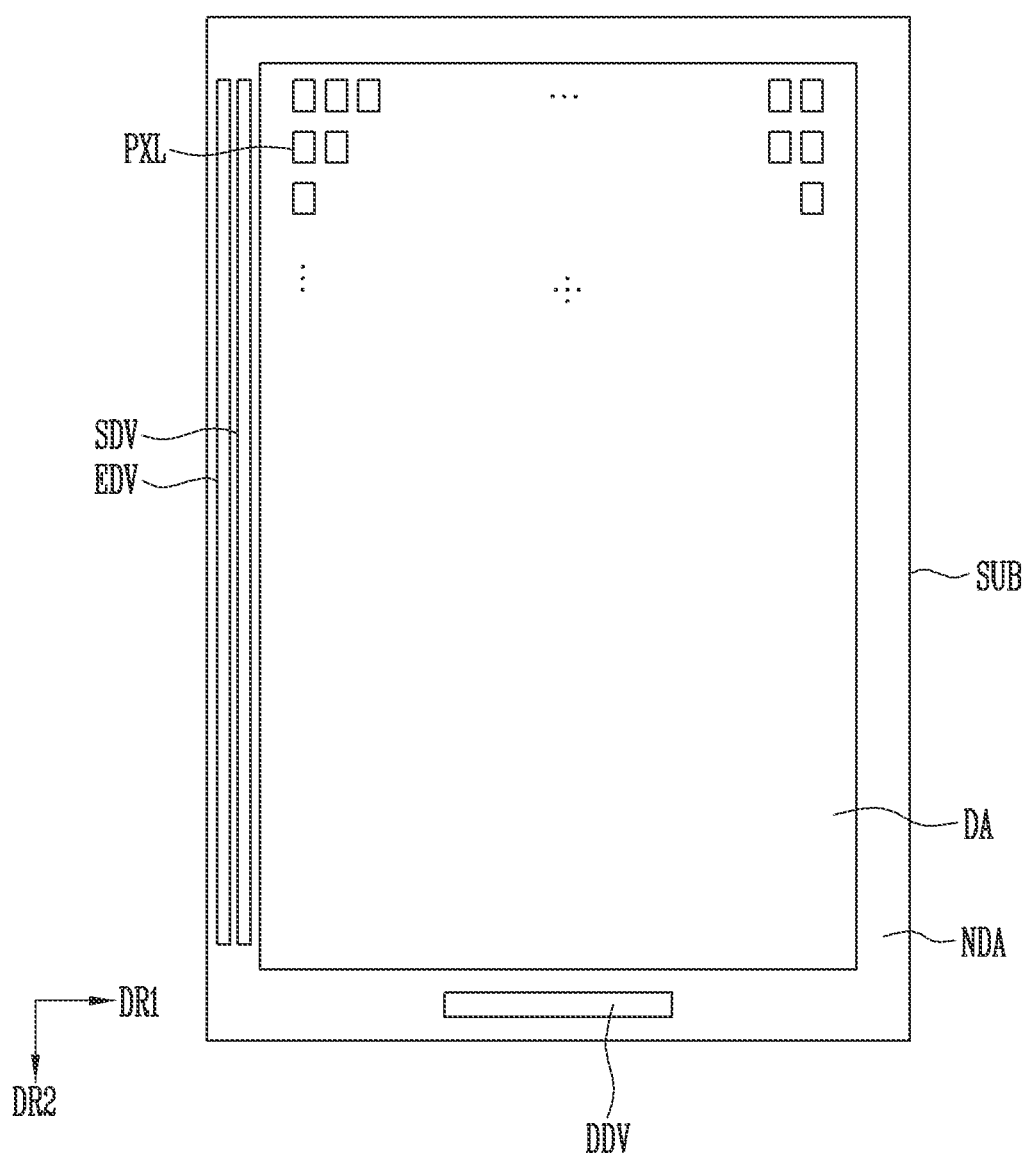
FIG. 10 illustrates a display device according to an embodiment of the present invention, and particularly, is a schematic plan view of the display device using the LED shown in FIG. 1 as a light emitting source.

FIG. 10 illustrates a display device according to an embodiment of the present invention, and particularly, is a schematic plan view of the display device using the bar type LED shown in FIG. 1 as a light emitting source.

Referring to FIGS. 1 to 10, the display device according to the present invention may include a substrate SUB, pixels PXL provided on the substrate SUB, a driving unit that is provided on the substrate SUB and drives the pixels PXL, and a line unit (not shown) that connects the pixels PXL and the driving unit.

The substrate SUB may include a display region DA and a non-display region NDA.

The display region DA may be a region in which the pixels PXL for displaying an image are provided. The non-display region NDA may be a region in which the driving unit for driving the pixels PXL and a portion of the line unit (not shown) that connects the pixels PXL and the driving unit are provided.

The non-display region NDA may be provided at at least one side of the display region DA. In an embodiment of the present invention, the non-display region NDA may surround the circumference of the display region DA.

The pixels PXL may be provided in the display region DA on the substrate SUB. Each of the pixels PXL is a minimum unit for displaying an image, and may be provided in plurality. Each pixel PXL may include a light emitting element that emits whit light and/or colored light.

The driving unit provides a signal to each pixel PXL through the line unit, and accordingly, the driving of the pixel PXL can be controlled. In FIG. 10, the line unit is omitted for convenience of description.

The drive unit may include a scan driver SDV for providing a scan signal to the pixels PXL through scan lines, an emission driver EDV for providing an emission control signal to the pixels PXL through emission control lines, a data driver DDV for providing a data signal to the pixels PXL through data lines, and a timing controller (not shown). The timing controller may control the scan driver SDV, the emission driver EDV, and the data driver DDV.

Figure 11:
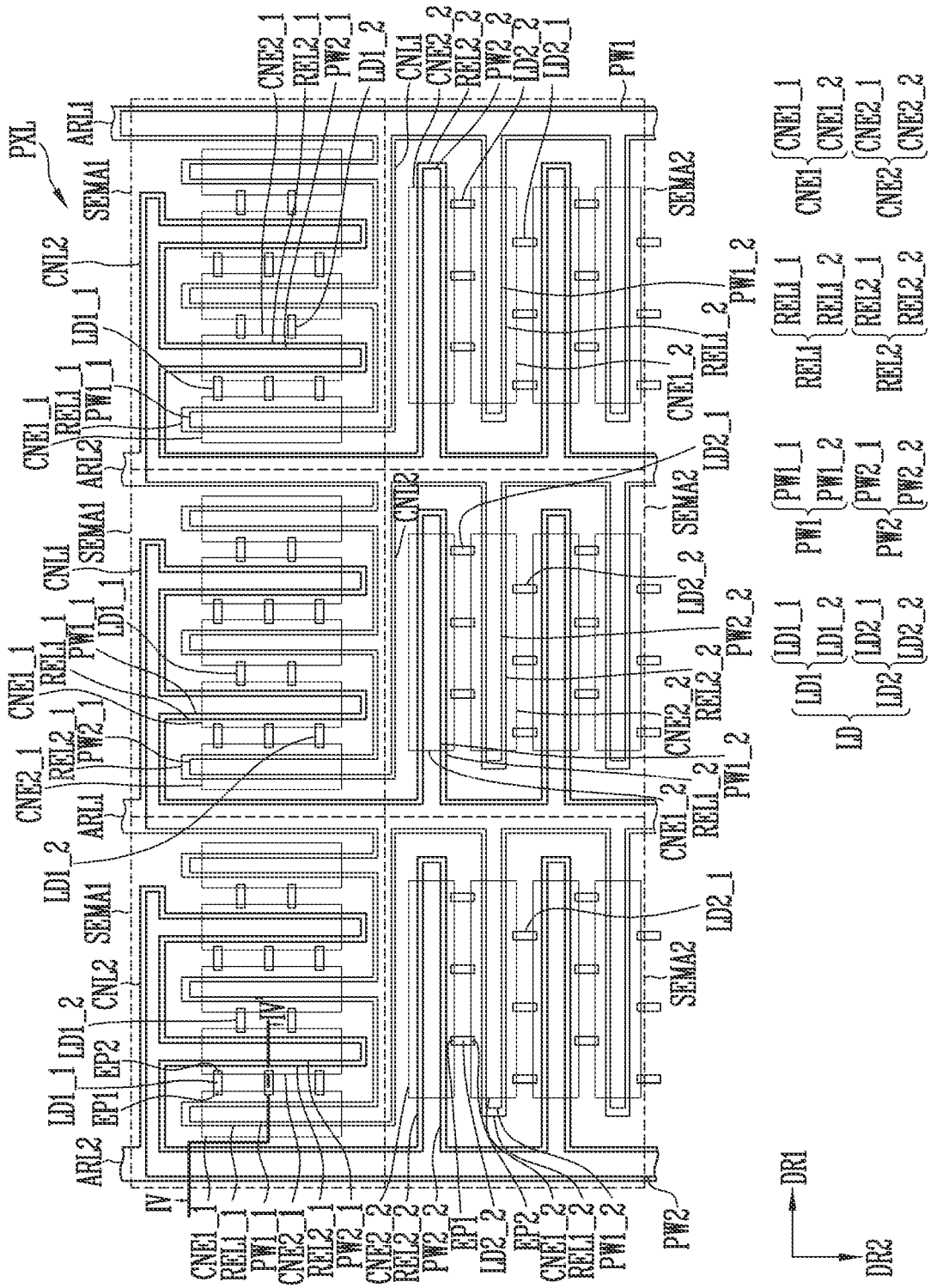
FIG. 11 is a plan view schematically illustrating first to third sub-pixels included in one pixel among pixels shown in FIG. 10.
Figure 12:
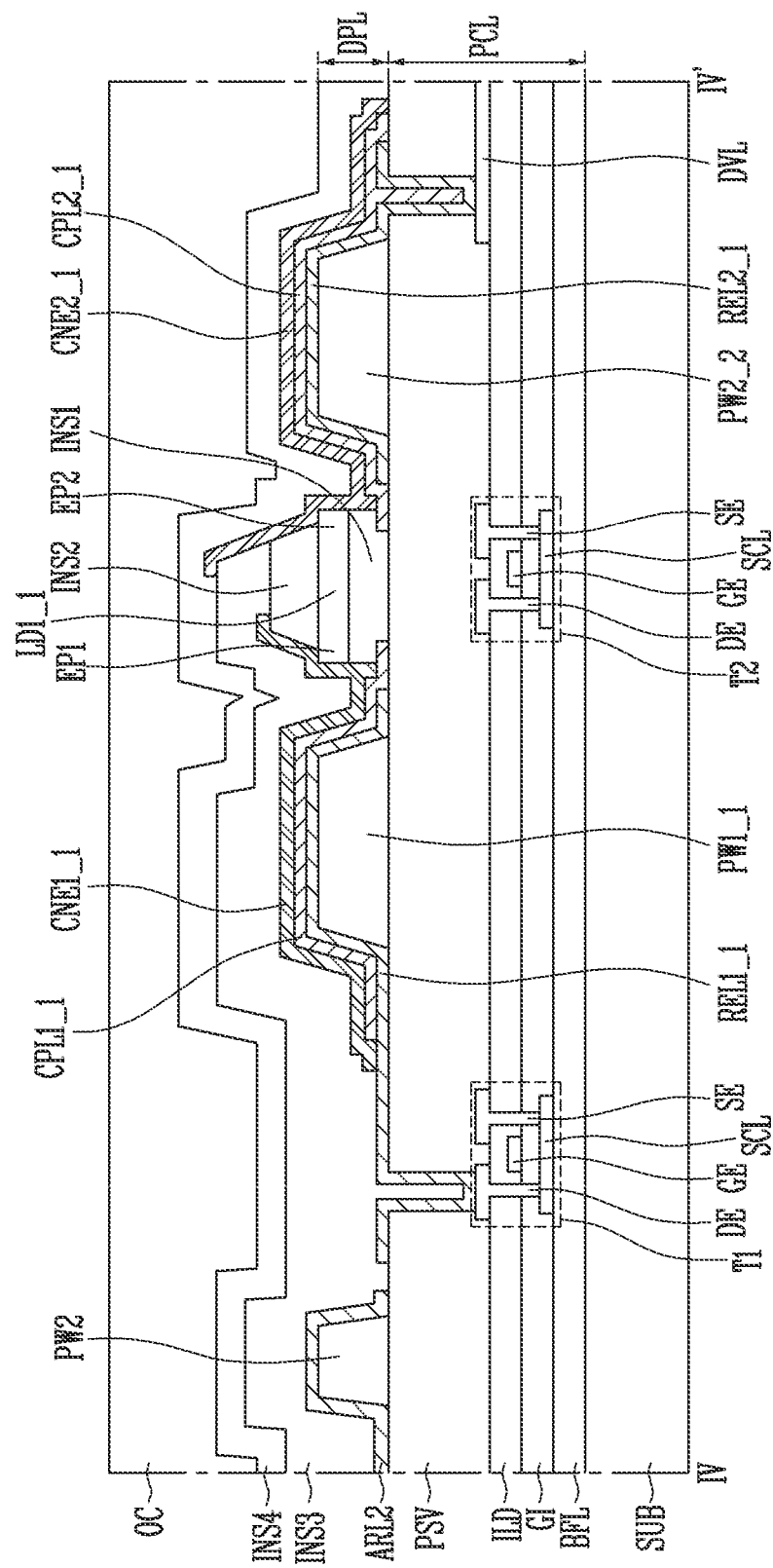
FIG. 12 is a sectional view taken along line IV-IV' of FIG. 11.
Figure 13:
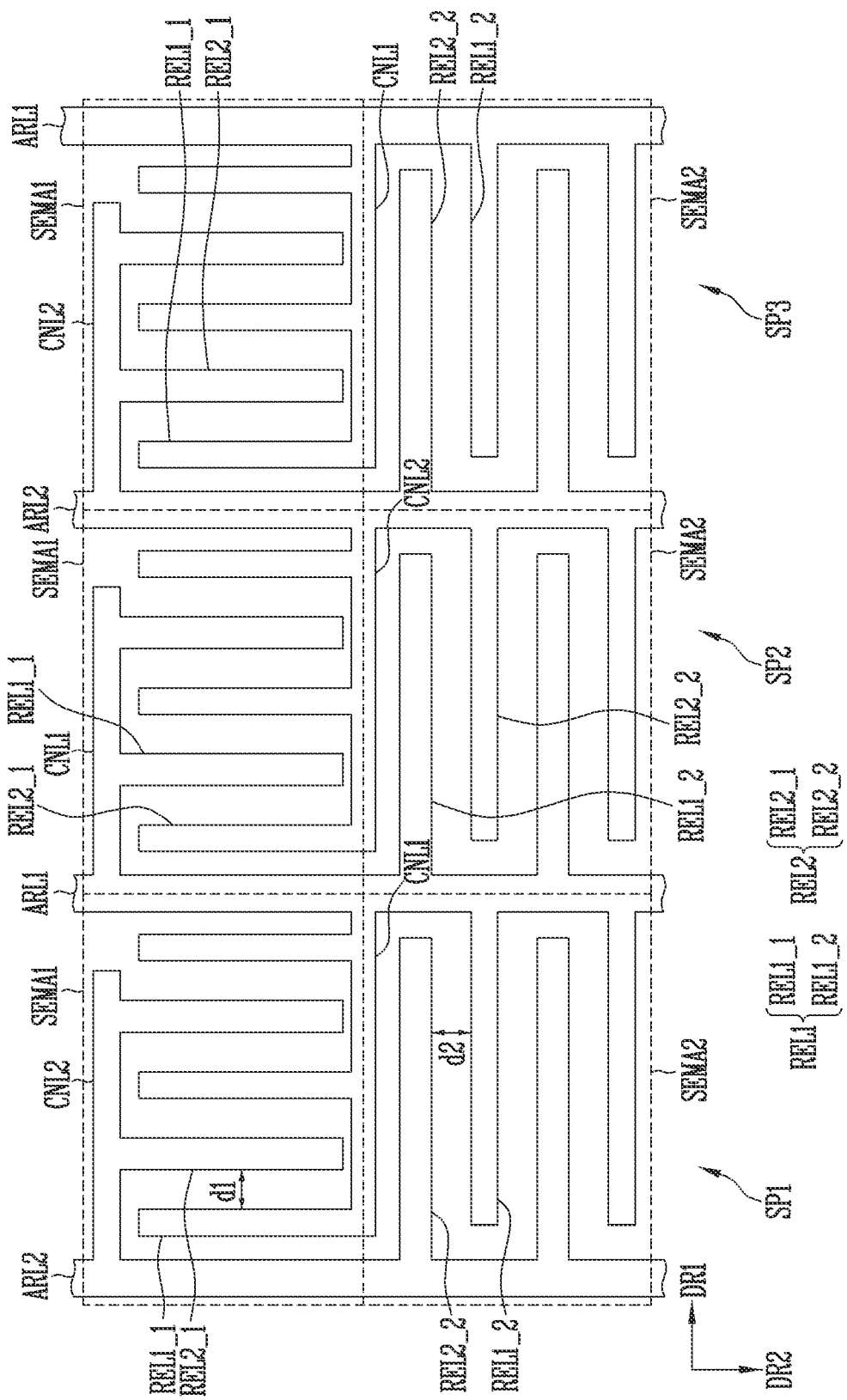
FIG. 13 is a plan view illustrating only first and second alignment lines and first and second electrodes of FIG. 11.

FIG. 11 is a plan view schematically illustrating first to third sub-pixels included in one pixel among the pixels shown in FIG. 10. FIG. 12 is a sectional view taken along line IV-IV of FIG. 11. FIG. 13 is a plan view illustrating only first and second alignment lines and first and second electrodes of FIG. 11.

In FIG. 11, illustration of a transistor connected to bar type LEDs and signal lines connected to the transistor is omitted for convenience of description.

In this embodiment, portions different from those of the above-described embodiment will be mainly described to avoid redundancy. Portions not particularly described in this embodiment follow those of the above-described embodiment. In addition, identical reference numerals refer to identical components, and similar reference numerals refer to similar components. In FIG. 11, a unit light emitting region may be a pixel region of one sub-pixel.

Referring to FIGS. 1 to 13, the display device according to the embodiment of the present invention may include a substrate SUB on which a plurality of pixels PXL are provided.

Each of the plurality of pixels PXL may include a first sub-pixel SP1, a second sub-pixel SP2, and a third sub-pixel SP3, which are provided on the substrate SUB.

Each of the first to third sub-pixels SP1, SP2, and SP3 may include the substrate SUB, a pixel circuit layer PCL provided on the substrate SUB, and a display element layer DPL provided on the pixel circuit layer PCL.

The pixel circuit layer PCL may include a buffer layer BFL disposed on the substrate SUB, first and second transistor T1 and T2 disposed on the buffer layer BFL, and a driving voltage line DVL. Also, the pixel circuit layer PCL may further include a protective layer PSV provided over the first and second transistors T1 and T2 and the driving voltage line DVL.

The display element layer DPL may include first and second partition walls PW1 and PW2, first and second electrodes REL1 and REL2, first and second alignment lines ARL1 and ARL2, LEDs LD, and first and second contact electrodes CNE1 and CNE2.

For convenience, the pixel circuit layer PCL is first described, and the display element layer DPL is then described.

The buffer layer BFL may be provided on the substrate SUB, and prevent an impurity from being diffused into the first and second transistors T1 and T2.

The first transistor T1 may be a driving transistor electrically connected to some of the LEDs LD provided in the display element layer DPL to drive a corresponding LED LD, and the second transistor T2 may be a switching transistor that switches the first transistor T1.

Each of the first and second transistors T1 and T2 may include a semiconductor layer SCL, a gate electrode GE, a source electrode SE, and a drain electrode DE.

The semiconductor layer SCL may be disposed on the buffer layer BFL. The semiconductor layer SCL may include a first region in contact with the drain electrode DE and a second region in contact with the source electrode SE. A region between the first region and the second region may be a channel region.

In an embodiment of the present invention, the first region may be a drain region, and the second region may be a source region.

The semiconductor layer SCL may be a semiconductor pattern made of poly-silicon, amorphous silicon, oxide semiconductor, etc. The channel region is a semiconductor pattern undoped with an impurity, and may be an intrinsic semiconductor. The first region and the second region are semiconductor patterns dope with the impurity.

The gate electrode GE may be provided on the semiconductor layer SCL with a gate insulating layer GI interposed therebetween.

The drain electrode DE and the source electrode SE may be in contact with the first region and the second region of the semiconductor layer SCL through contact holes penetrating an interlayer insulating layer ILD and the gate insulating layer GI, respectively.

The driving voltage line DVL may be provided on the interlayer insulating layer ILD. A second driving power source VSS may be applied to the driving voltage line DVL.

The protective layer PSV may include a contact hole for exposing the drain electrode DE of the first transistor T1 and a contact hole for exposing the driving voltage line DVL.

The first and second partition walls PW1 and PW2 may be provided on the protective layer PSV to be spaced apart from each other at a certain distance. The first electrode REL1 may be provided on the first partition wall PW1, and the second electrode REL2 may be provided on the second partition wall PW2.

The first electrode REL1 may include a (1-1)th electrode REL1_1 extending along a second direction DR2 and a (1-2)th electrode REL1_2 extending along a first direction DR1 intersecting the second direction DR2.

The (1-1)th electrode REL1_1 may be electrically connected to the drain electrode DE of the first transistor T1 through a contact hole of the protective layer PSV, which exposes a portion of the drain electrode DE of the first transistor T1. Therefore, a signal applied to the first transistor T1 may be transferred to the (1-1)th electrode REL1_1.

The second electrode REL2 may include a (2-1)th electrode REL2_1 extending along the second direction DR2 and a (2-2)th electrode REL2_2 extending along the first direction DR1.

The (2-1)th electrode REL2_1 may be electrically connected to the driving voltage line DVL through a contact hole of the protective layer PSV, which exposes a portion of the driving voltage line DVL. Therefore, the second driving power source VSS of the driving voltage line DVL may be transferred to the (2-1)th electrode REL2_1.

A (1-1)th capping layer CPL1_1 and a (2-1)th capping layer CPL2_1 may be provided on the (1-1)th electrode REL1_1 and the (2-1)th electrode REL2_1, respectively.

The first contact electrode CNE1 for electrically and/or physically stably connecting the first electrode REL1 and a corresponding LED LD may be disposed on the first electrode REL1. When viewed on a plane, the first contact electrode CNE1 may overlap with the first electrode REL1.

Since the corresponding LED LD is electrically connected to the first electrode REL1 through the first contact electrode CNE1, the signal applied to the drain electrode DE of the first transistor T1 may be finally applied to any one of both end portions EP1 and EP2 of the corresponding LED LD.

A third insulating layer INS3 may be provided over the first contact electrode CNE1.

The second contact electrode CNE2 for electrically and/or physically stably connecting the second electrode REL2 and a corresponding LED LD may be provided on the second electrode REL2. When viewed on a plane, the second contact electrode CNE2 may overlap with the second electrode REL2.

Since the corresponding LED LD is electrically connected to the second electrode REL2 through the second contact electrode CNE2, the second driving power source VSS of the driving voltage line DVL may be finally applied to any one of both end portions EP1 and EP2 of the corresponding LED LD.

When a predetermined voltage or more is applied to both the end portions EP1 and EP2 of the corresponding LED LD, the corresponding LED LD emits light.

A fourth insulating layer INS4 may be provided over the second contact electrode CNE2, and an overcoat layer OC may be provided on the fourth insulating layer INS4.

The first alignment line ARL1 may transfer a first alignment voltage to the first electrode REL1 to align the LEDs LD in a corresponding sub-pixel. The second alignment line ARL2 may transfer a second alignment voltage to the second electrode REL2 to align the LEDs LD in a corresponding sub-pixel.

In an embodiment of the present invention, a ground voltage GND may be as the first alignment voltage to the first alignment line ARL1, and an AC voltage may be applied as the second alignment voltage to the second alignment line ARL2.

When predetermined voltages having different voltage levels are respectively applied to the first alignment line ARL1 and the second alignment line ARL2, an electric field may be formed between the first electrode REL1 and the second electrode REL2.

Each of the LEDs LD may include a first conductive semiconductor layer 11, a second conductive semiconductor layer 13, and an active layer 12 interposed between the first and second conductive semiconductor layers 11 and 13.

The LEDs LD may include a first LED LD1 aligned between the (1-1)th electrode REL1_1 and the (2-1)th electrode REL2_1 and a second LED LD2 aligned between the (1-2)th electrode REL1_2 and the (2-2)th electrode REL2_2.

In an embodiment of the present invention, the first LED LD1 may be aligned along the first direction DR1, and include first and second end portions EP1 and EP2 in the first direction DR1. In addition, the second LED LD2 may be aligned along the second direction DR2, and include first and second end portions EP1 and EP2 in the second direction DR2.

A first insulating layer INS1 may be provided on the bottom of each of the first and second LEDs LD1 and LD2. A second insulating layer INS2 covering a partial upper surface of each of the first and second LEDs LD1 and LD2 may be provided over the first and second LEDs LD1 and LD2.

The unit light emitting region of each of the first to third sub-pixel SP1 to SP3 may include a first sub-light emitting region SEMA1 in which the first LED LD1 is provided and a second sub-light emitting region SEMA2 in which the second LED LD2 is provided.

Hereinafter, an arrangement relationship of the first and second electrodes REL1 and REL2 and the first and second alignment lines ARL1 and ARL2 will be described with reference to FIG. 13.

As shown in FIG. 13, the (1-1)th and (2-1)th electrodes REL1_1 and REL2_1 may be provided in the first sub-light emitting region SEMA1 of each of the first to third sub-pixels SP1 to SP3, and the (1-2)th and (2-2)th electrodes REL1_2 and REL2_2 may be provided in the second sub-light emitting region SEMA2 of each of the first to third sub-pixels SP1 to SP3.

The (1-1)th electrode REL1_1 may branch off in the second direction DR2 from a first connection line CNL1 extending along the first direction DR1, and be provided in plurality in the first sub-light emitting region SEMA1.

The first connection line CNL1 may be connected to the first alignment line ARL1 to transfer the first alignment voltage of the first alignment line ARL1 to the (1-1)th electrode REL1_1. The first connection line CNL1 may be integrally provided with the first alignment line ARL1, and be disposed in the same layer.

The (2-1)th electrode REL2_1 may branch off in the second direction DR2 from a second connection line CNL2 extending in the first direction DR1, and be provided in plurality in the first sub-light emitting region SEMA1.

The second connection line CNL2 may be connected to the second alignment line ARL2 to transfer the second alignment voltage of the second alignment line ARL2 to the (2-1)th electrode REL2_1. The second connection line CNL2 may be integrally provided with the second alignment line ARL2, and be disposed in the same layer.

In the first sub-light emitting region SEMA1, the (1-1)th electrode REL1_1 and the (2-1)th electrode REL2_1 may be alternately disposed along the first direction DR1.

When the LEDs LD are aligned in a corresponding sub-pixel, a predetermined voltage may be applied to each of the (1-1)th and (2-1)th electrodes REL1_1 and REL2_1 through the first and second alignment lines ARL1 and ARL2.

Therefore, an electric field may be formed between the (1-1)th and (2-1)th electrodes REL1_1 and REL2_1, and the first LED LD1 among the LEDs LD may be aligned between the (1-1)th and (2-1)th electrodes REL1_1 and REL2_1.

In the first sub-light emitting region SEMA1, any one of both the end portions EP1 and EP2 of the first LED LD1 is connected to the (1-1)th electrode REL1_1, and the other of both the end portions EP1 and EP2 of the first LED LD1 is connected to the (2-1)th electrode REL2_1. Therefore, the first LED LD1 may be aligned in the first direction DR1.

The (1-2)th electrode REL1_2 may branch off in the first direction DR1 from the first alignment line ARL1, and be provided in plurality in the second sub-light emitting region SEMA2.

The (2-2)th electrode REL2_2 may branch off in the first direction DR1 from the second alignment line ARL2, and be provided in plurality in the second sub-light emitting region SEMA2.

In the second sub-light emitting region SEMA2, the (1-2)th electrode REL1_2 and the (2-2)th electrode REL2_2 may be alternately disposed along the second direction DR2.

When the LEDs LD are aligned in a corresponding sub-pixel, a predetermined voltage may be applied to each of the (1-2)th and (2-2)th electrodes REL1_2 and REL2_2 through the first and second alignment lines ARL1 and ARL2.

Therefore, an electric field may be formed between the (1-2)th and (2-2)th electrodes REL1_2 and REL2_2, and the second LED LD2 among the LEDs LD may be aligned between the (1-2)th and (2-2)th electrodes REL1_2 and REL2_2.

In the second sub-light emitting region SEMA2, any one of both the end portions EP1 and EP2 of the second LED LD2 is connected to the (1-2)th electrode REL1_2, and the other of both the end portions EP1 and EP2 of the second LED LD2 is connected to the (2-2)th electrode REL2_2. Therefore, the second LED LD2 may be aligned in the second direction DR2.

A distance d1 between the (1-1)th and (2-1)th electrodes REL1_1 and REL2_1 in the first sub-light emitting region SEMA1 and a distance d2 between the (1-2)th and (2-2)th electrode REL1_2 and REL2_2 in the second sub-light emitting region SEMA2 may be designed to be the same.

As described above, the first and second LEDs LD1 and LD2 are aligned in different directions in a corresponding sub-light emitting region, and thus lights respectively emitted from the first and second LEDs LD1 and LD2 are not concentrated in a specific direction. Accordingly, the display device can have a uniform light output distribution throughout the entire region.

Figure 14:
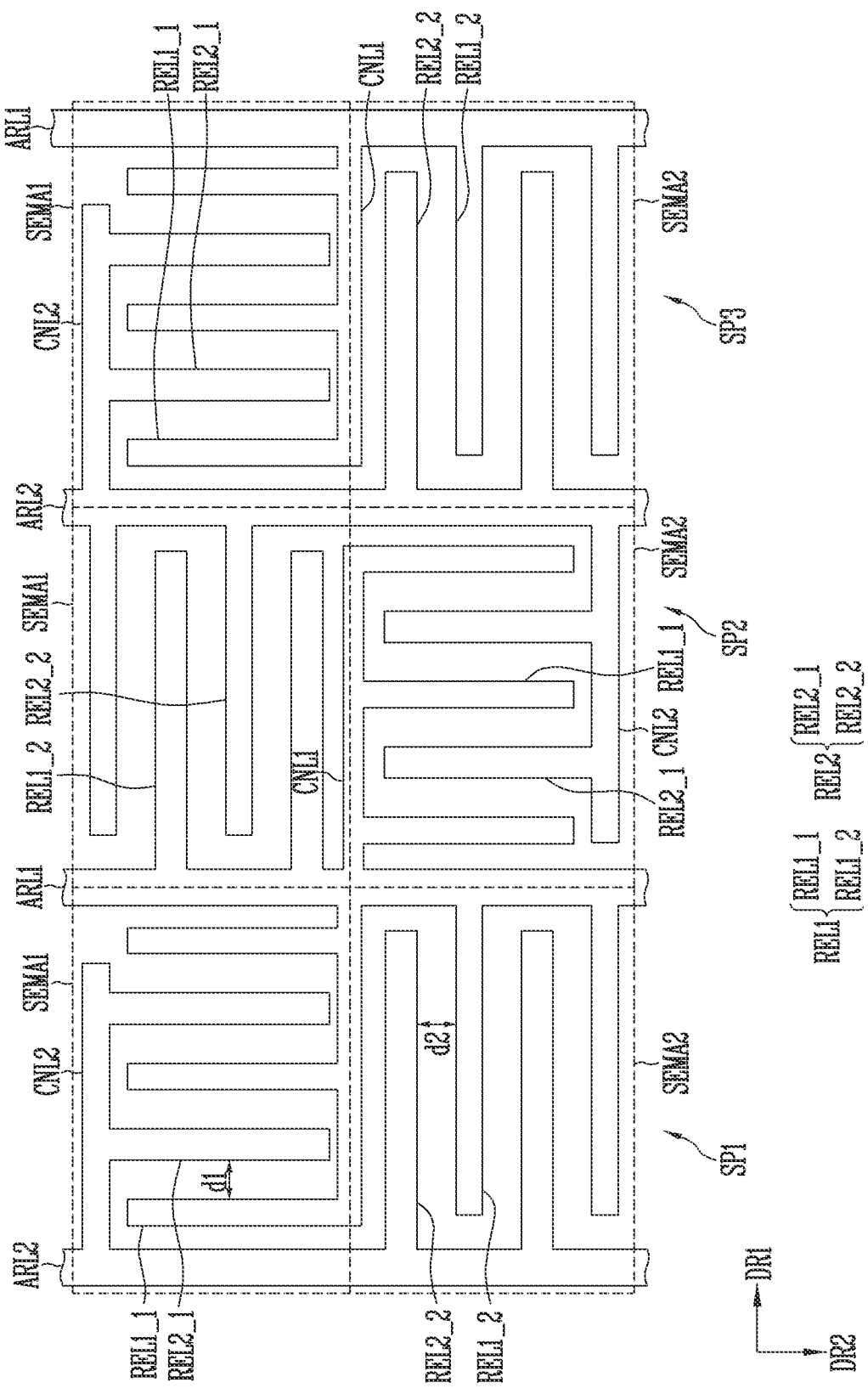
FIGS. 14 to 16 are plan views illustrating another embodiment of first and second alignment lines and first and second electrodes, which are disposed in one pixel, in the display device of FIG. 11.
Figure 15:
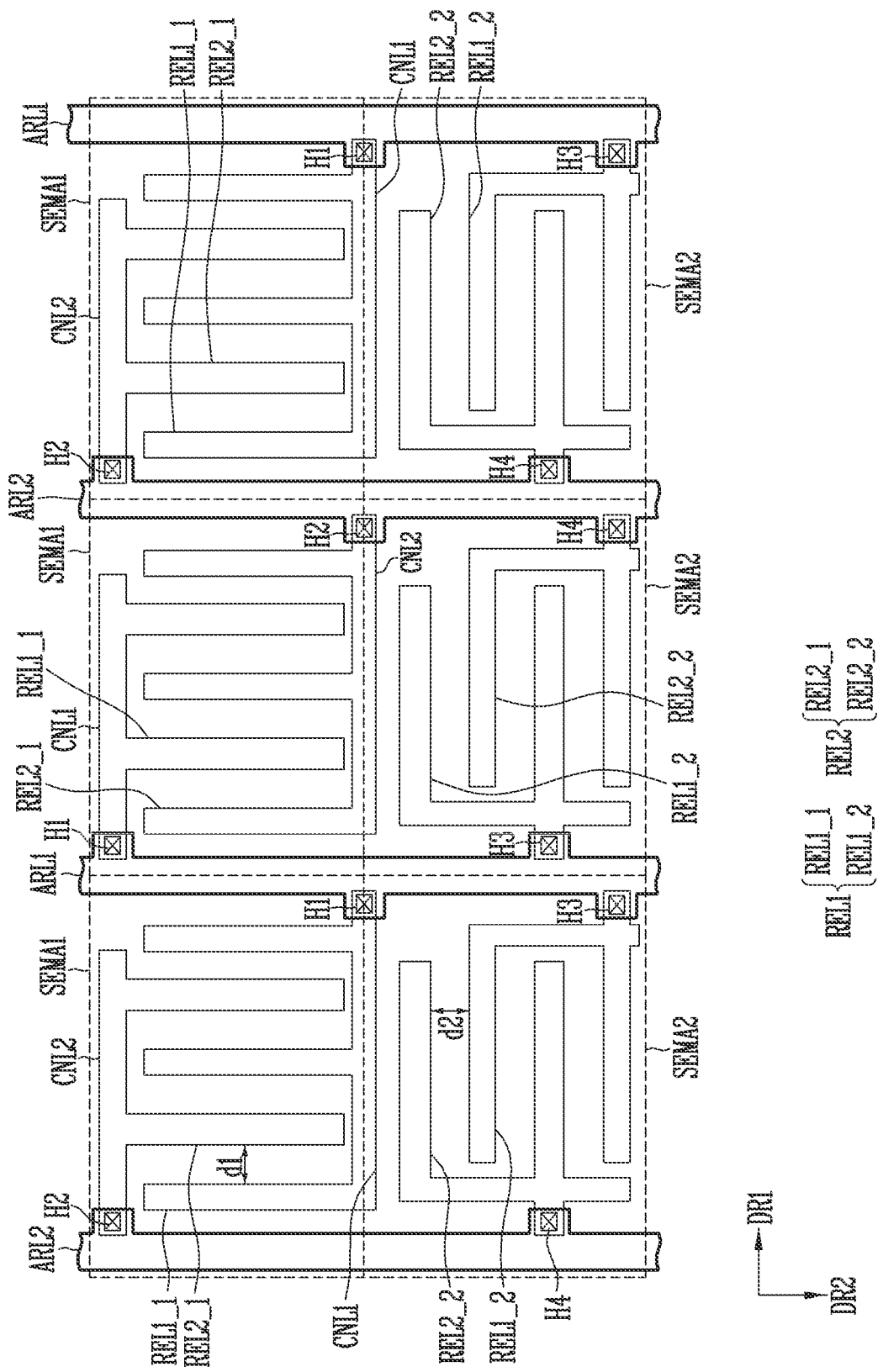
Figure 16:
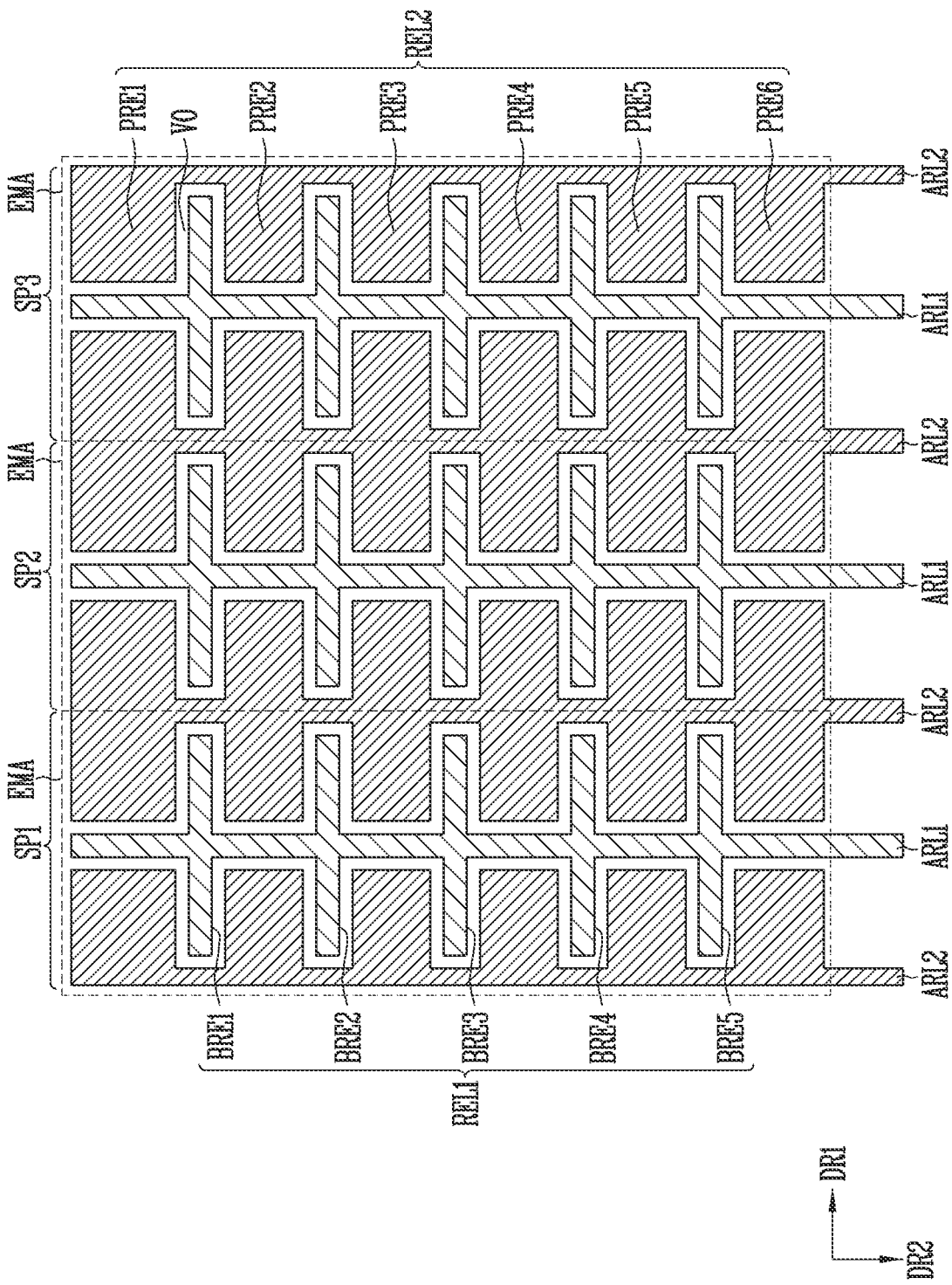

FIGS. 14 to 16 are plan views illustrating another embodiment of the first and second alignment lines and the first and second electrodes, which are disposed in one pixel, in the display device of FIG. 11. In this embodiment, portions different from those of the above-described embodiment will be mainly described to avoid redundancy. Portions not particularly described in this embodiment follow those of the above-described embodiment. In addition, identical reference numerals refer to identical components, and similar reference numerals refer to similar components.

In FIGS. 14 to 16, only first and second electrodes, first and second connection lines, and first and second alignment lines, which are provided in first and second sub-light emitting regions, are illustrated for convenience.

First, FIGS. 11, 12, and 14, the display device according to the embodiment of the present invention may include a substrate SUB on which a plurality of pixels PXL are provided. Each pixel PXL may include first to third sub-pixels SP1 to SP3.

A unit light emitting region of each of the first to third sub-pixels SP1 to SP3 may include first and second sub-light emitting regions SEMA1 and SEMA2.

In an embodiment of the present invention, (1-1)th and (2-1)th electrodes REL1_1 and REL2_1 extending in a second direction DR2 may be provided in the first sub-light emitting region SEMA1 of each of the first and third sub-pixels SP1 and SP3.

(1-2)th and (2-2)th electrodes REL1_2 and REL2_2 extending in a first direction DR1 intersecting the second direction DR2 may be provided in the second sub-light emitting region SEMA2 of each of the first and third sub-pixels SP1 and SP3.

In the first and third sub-pixels SP1 and SP3, a first LED LD1 may be provided in the first sub-light emitting region SEMA1, and a second LED LD2 may be provided in the second sub-light emitting region SEMA2.

(1-2)th and (2-2)th electrodes REL1_2 and REL2_2 extending in the first direction DR1 may be provided in the first sub-light emitting region of the second sub-pixel SP2, and (1-1)th and (2-1)th electrodes REL1_1 and REL2_1 extending the second direction DR2 may be provided in the second sub-light emitting region of the second sub-pixel SP2.

In the second sub-pixel SP2, the second LED LD2 may be provided in the first sub-light emitting region SEMA1, and the first LED LD1 may be provided in the second sub-light emitting region SEMA2.

In the first sub-light emitting region SEMA1 of each of the first and third sub-pixels SP1 and SP3, the first LED LD1 may be aligned in the first direction DR1. In the second sub-light emitting region SEMA2 of the second sub-pixel SP2, the first LED LD1 may be aligned in the first direction DR1.

In the second sub-light emitting region SEMA2 of each of the first and third sub-pixels SP1 and SP3, the second LED LD2 may be aligned in the second direction DR2. In the first sub-light emitting region SEMA1 of the second sub-pixel SP2, the second LED LD2 may be aligned in the second direction DR2.

As described above, LEDs LD provided in first sub-light emitting regions SEMA1 of two adjacent sub-pixels may be aligned in different directions, and LEDs LD provided in second sub-light emitting regions SEMA2 of two adjacent sub-pixels may be aligned in different directions.

Thus, lights respectively emitted from the first and second LEDs LD1 and LD2 are not further concentrated in a specific direction, but can advance in various directions. Accordingly, the display device can have a uniform light output distribution throughout the entire region.

Referring to FIGS. 11, 12, and 15, the display device according to the embodiment of the present invention may include a substrate SUB on which a plurality of pixels PXL are provided. Each pixel PXL may include first to third sub-pixels SP1 to SP3.

A unit light emitting region of each of the first to third sub-pixels SP1, SP2, and SP3 may include first and second sub-light emitting regions SEMA1 and SEMA2.

(1-1)th and (2-1)th electrodes REL1_1 and REL2_1 may be provided in the first sub-light emitting region SEMA1 of each of the first to third sub-pixels SP1 to SP3, and (1-2)th and (2-2)th electrodes REL1_2 and REL2_2 may be provided in the second sub-light emitting region SEMA2 of each of the first to third sub-pixels SP1 to SP3.

The (1-1)th electrode REL1_1 may branch off along a second direction DR2 from a first connection line CNL1 to be provided in the first sub-light emitting region SEMA1. The first connection line CNL1 may be integrally provided with the (1-1)th electrode REL1_1.

The (2-1)th electrode REL2_1 may branch off along the second direction DR2 from a second connection line CNL2 to be provided in the first sub-light emitting region SEMA1. The second connection line CNL2 may be integrally provided with the (2-1)th electrode REL2_1.

The (1-2)th electrode REL1_2 may extend to the second sub-light emitting region SEMA2 along a first direction DR1 intersecting the second direction DR2, and the (2-2)th electrode REL2_2 may also extend to the second sub-light emitting region SEMA2 along the first direction DR1.

In an embodiment of the present invention, a first LED LD1 aligned in the first direction DR1 may be provided in the first sub-light emitting region SEMA1 of each of the first to third sub-pixels SP1 to SP3. In addition, a second LED LD2 aligned in the second direction DR2 may be provided in the second sub-light emitting region SEMA2 of each of the first to third sub-pixels SP1 to SP3.

In the first sub-light emitting region SEMA1, the first connection line CNL1 may be electrically connected to a first alignment line ARL1 through a first contact hole H1, and the second connection line CNL2 may be electrically connected to a second alignment line ARL2 through a second contact hole H2.

In the second sub-light emitting region, the (1-2)th electrode REL1_2 may be connected to the first alignment line ARL1 through a third contact hole H3, and the (2-2)th electrode REL2_2 may be connected to the second alignment line ARL2 through a fourth contact hole H4.

The first connection line CNL1 and the (1-1)th and (1-2)th electrodes REL1_1 and REL1_2 may be provided in a layer different from that of the first alignment line ARL1. In an embodiment of the present invention, the first alignment line ARL1 may be provided in the same layer as any one of components included in a pixel circuit layer PCL. For example, the first alignment line ARL1 may be provided in the same layer as a driving voltage line DVL of the pixel circuit layer PCL.

The second connection line CNL2 and the (2-1)th and (2-2)th electrodes REL2_1 and REL2_2 may be provided in a layer different from that of the second alignment line ARL2. In an embodiment of the present invention, the second alignment line ARL2 may be provided in the same layer as the first alignment line ARL1.

Referring to FIGS. 11, 12, and 16, the display device according to the embodiment of the present invention may include a substrate SUB on which a plurality of pixels PXL are provided. Each pixel PXL may include first to third sub-pixels SP1 to SP3.

Each of the first to third sub-pixels SP1 to SP3 may include a unit light emitting region EMA.

Each of the first to third sub-pixels SP1 to SP3 may include first and second electrodes REL1 and REL2 electrically separated from each other, a first alignment line ARL1 connected to the first electrode REL1, and a second alignment line ARL2 connected to the second electrode REL2.

The first electrode REL1 may include a plurality of branch electrodes BRE1 to BRE5 branching off in a first direction DR1 from the first alignment line ARL1 extending in a second direction DR2 intersecting the first direction DR1. Each of the branch electrodes BRE1 to BRE5 may be spaced apart from a branch electrode disposed adjacent thereto in the second direction DR2 at a certain distance.

The branch electrodes BRE1 to BRE5 may extend to both sides of the first alignment line ARL1 along the first direction DR1. The branch electrodes BRE1 to BRE5 may be integrally provided with the first alignment line ARL1.

The second electrode REL2 may include a plurality of protrusion electrodes PRE1 to PRE6 protruding in the first direction DR1 from the second alignment line ARL2 extending in the second direction DR2. The protrusion electrodes PRE1 to PRE6 may be integrally provided with the second alignment line ARL2.

Each of the protrusion electrodes PRE1 to PRE6 may be spaced apart from a protrusion electrode adjacent thereto in the second direction DR2 at a certain distance, and a void VO may be provided between the adjacent protrusion electrodes.

In an embodiment of the present invention, one branch electrode of the first electrode REL1 may be disposed to correspond to the void VO of the second electrode REL2. When viewed on a plane, one branch electrode of the first electrode REL1 may be disposed to be spaced apart from one protrusion electrode of the second electrode REL2.

The second electrode REL2 may be provided in a shape surrounding the circumference of the first electrode REL1.

When LEDs LD are aligned in a corresponding sub-pixel, a predetermined voltage may be applied to the first and second electrodes REL1 and REL2 respectively through the first and second alignment lines ARL1 and ARL2. Therefore, an electric field may be formed between the first and second electrodes REL1 and REL2, and the LEDs LD may be aligned between the first and second electrodes REL1 and REL2.

Some of the LEDs LD may be aligned in the first direction DR1, other some of the LEDs LD may be aligned in the second direction DR2, and the others of the LEDs LD may be aligned in an oblique direction between the first and second directions DR1 and DR2.

As described above, the LEDs LD are aligned in different directions in a corresponding unit light emitting region EMA, so that lights respectively emitted from the LEDs LD are not concentrated in a specific direction.

Figure 17A:
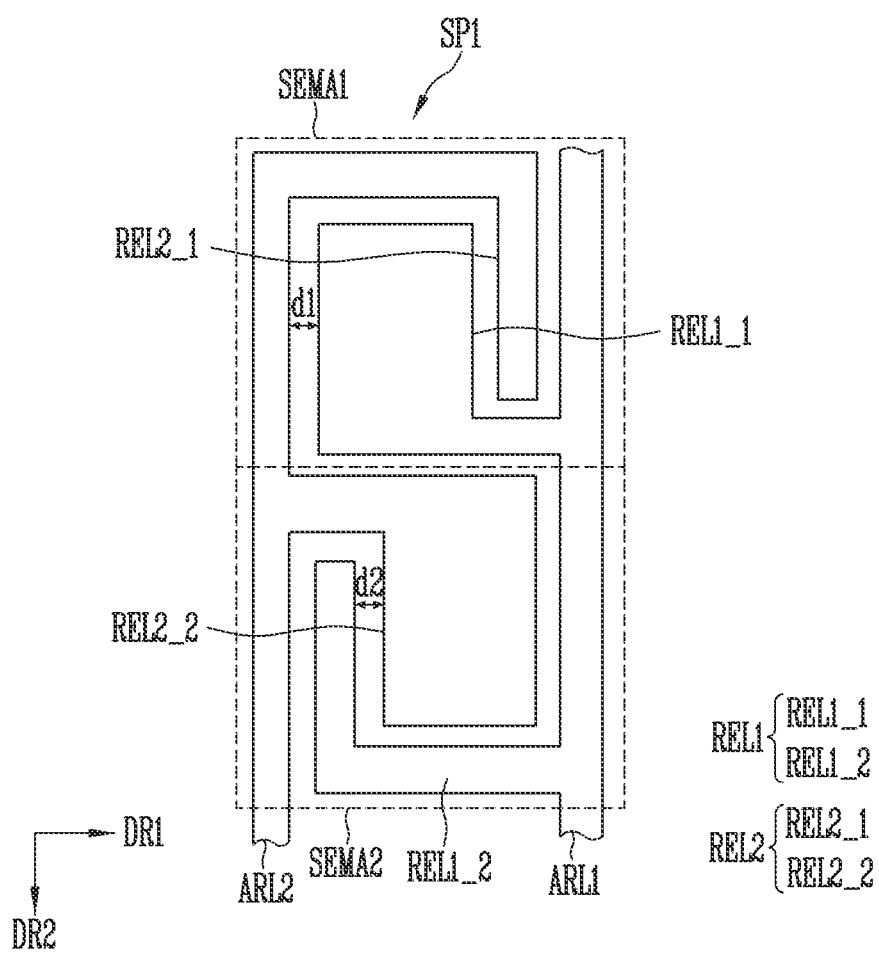
FIGS. 17A to 17C are plan views illustrating another embodiment of the first and second alignment lines and the first and second electrodes, which are disposed in one pixel, in the display device of FIG. 11.
Figure 17B:
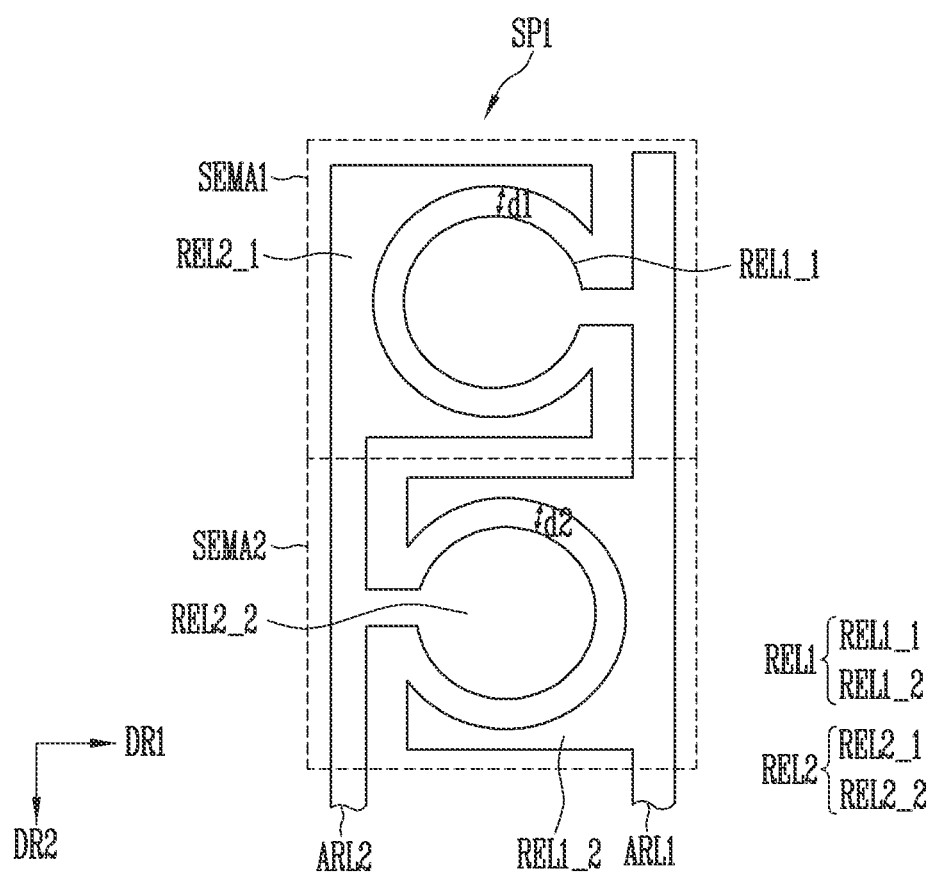
Figure 17C:
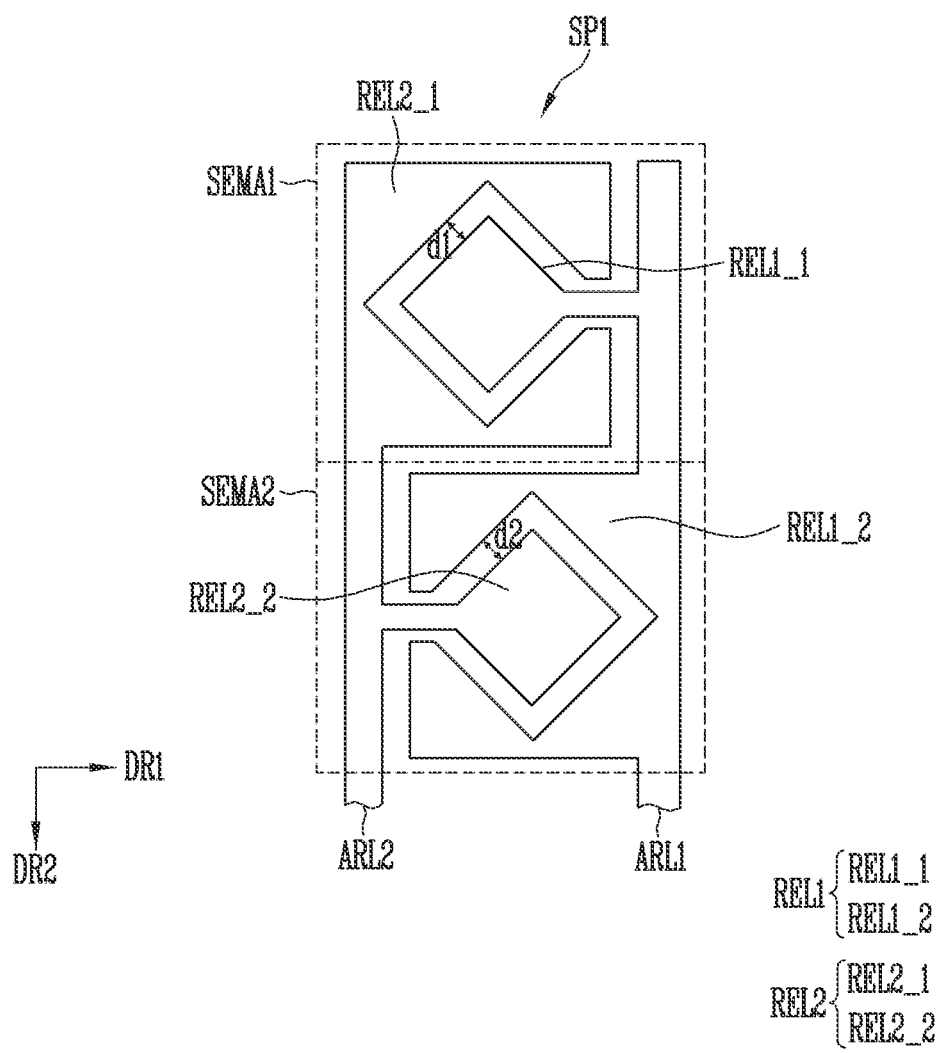
Figure 18A:
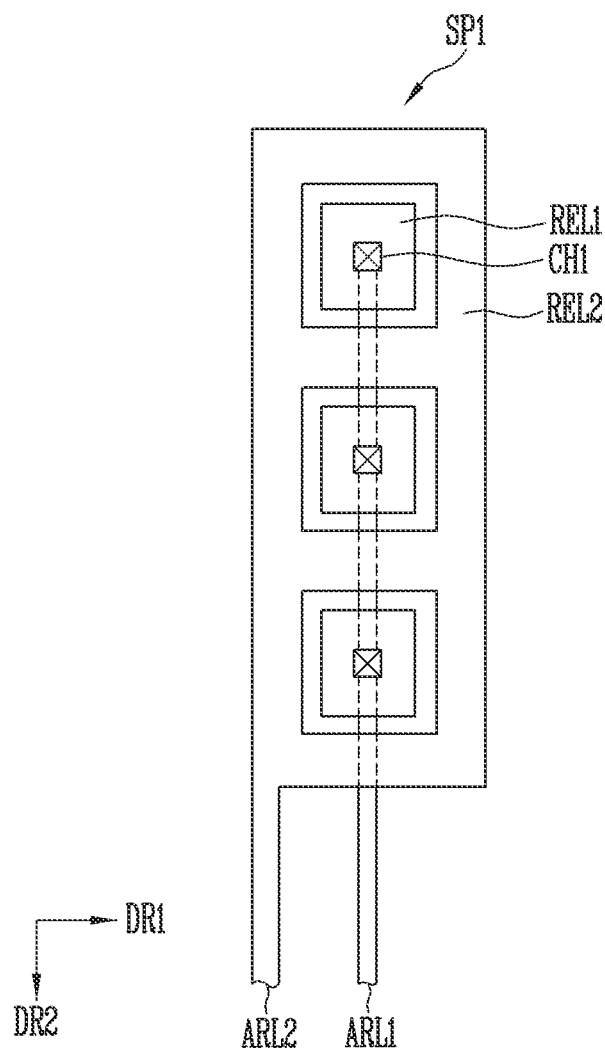
FIGS. 18A to 18D are plan views illustrating another embodiment of the first and second alignment lines and the first and second electrodes, which are disposed in one pixel, in the display device of FIG. 11.
Figure 18B:
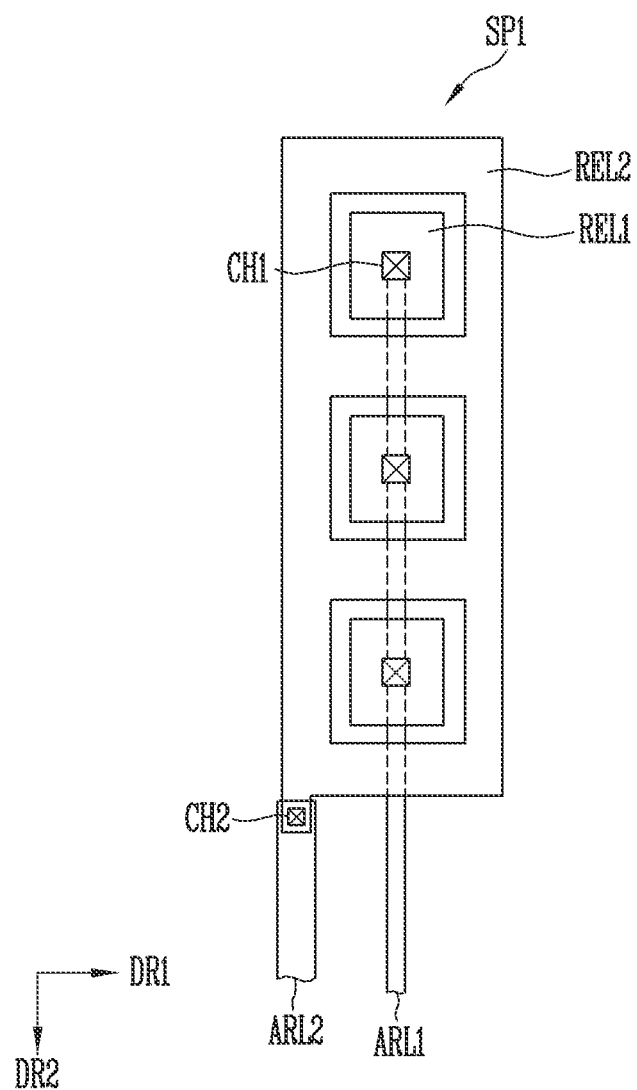
Figure 18C:
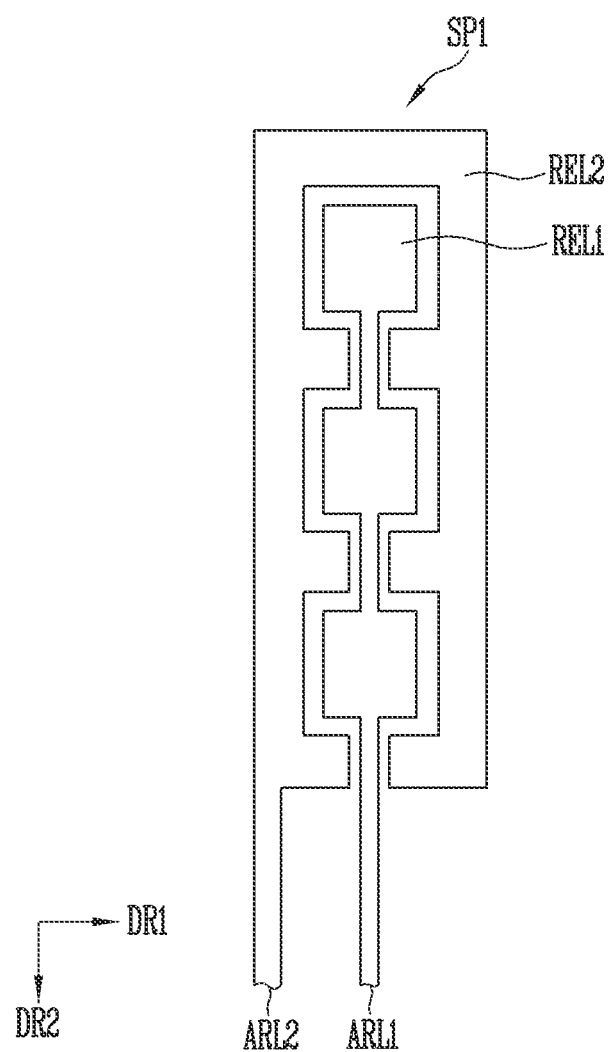
Figure 18D:
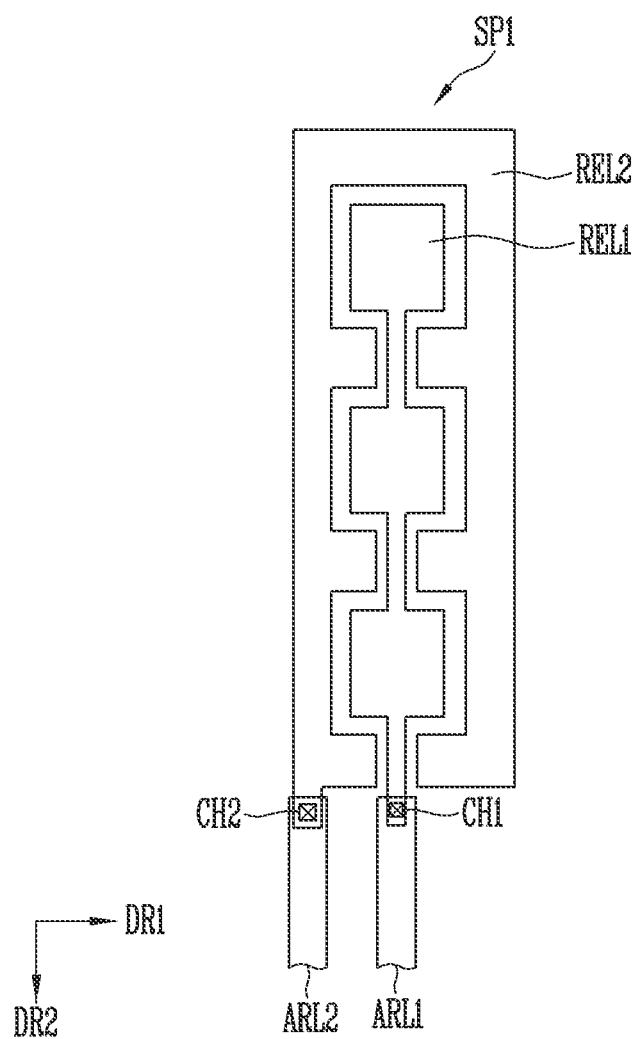
Figure 19A:
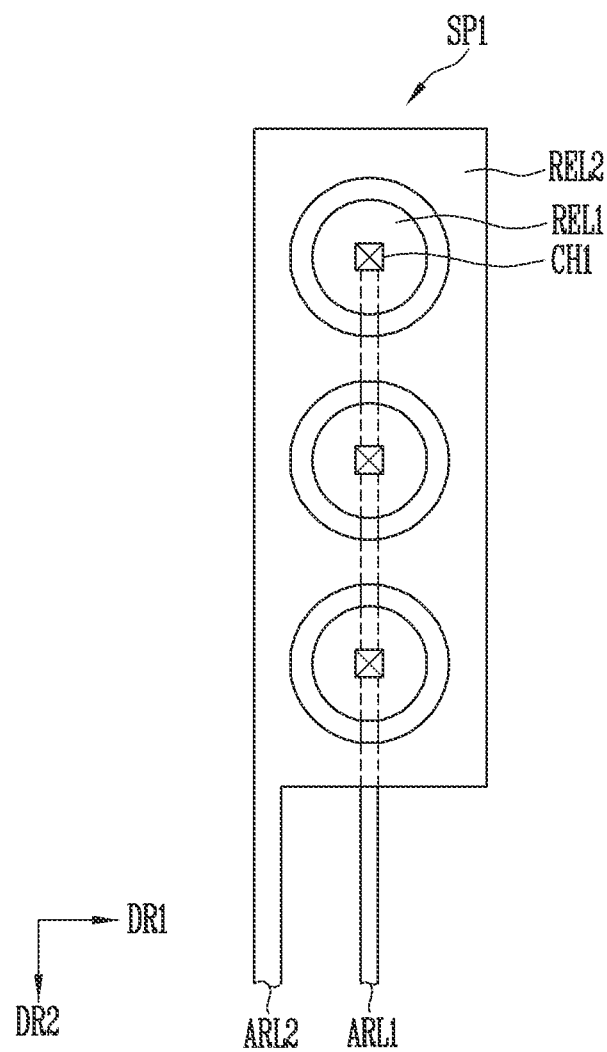
FIGS. 19A to 19D are plan views illustrating another embodiment of the first and second alignment lines and the first and second electrodes, which are disposed in one pixel, in the display device of FIG. 11.
Figure 19B:
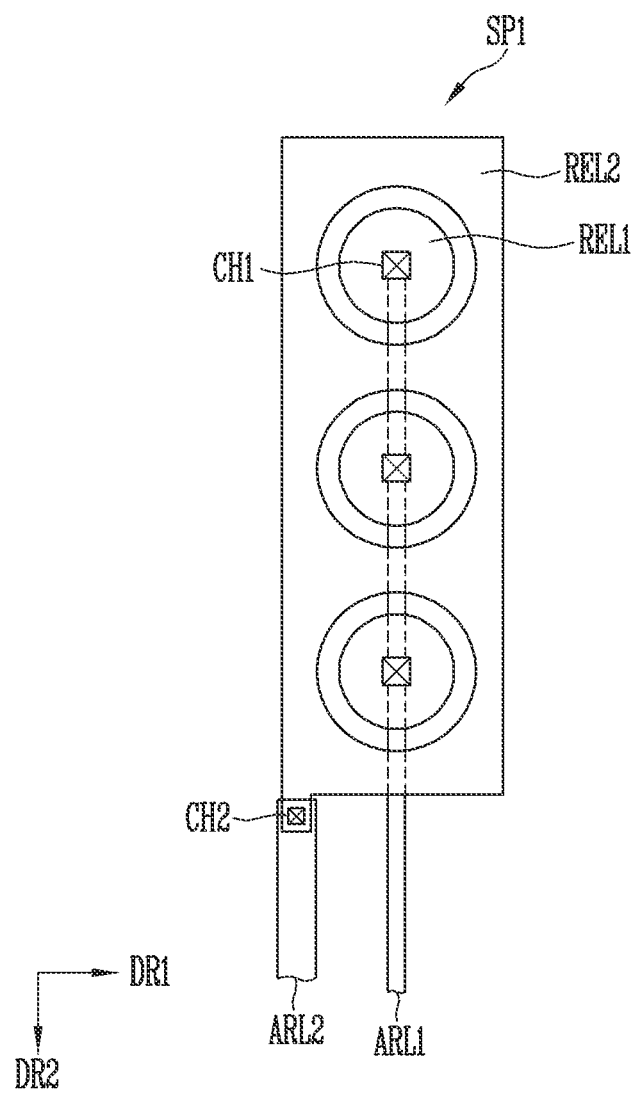
Figure 19C:
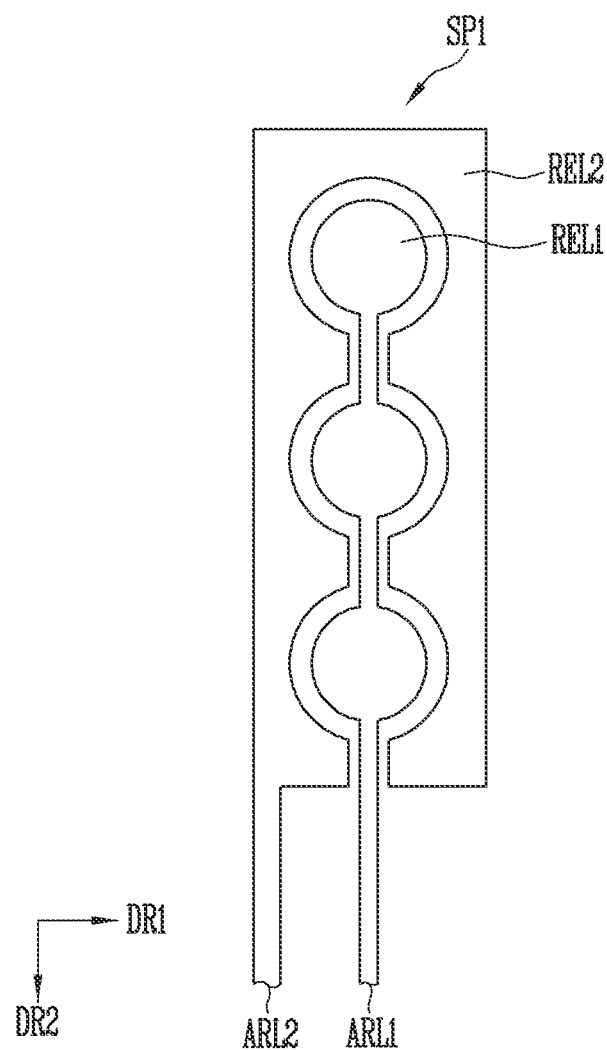
Figure 19D:
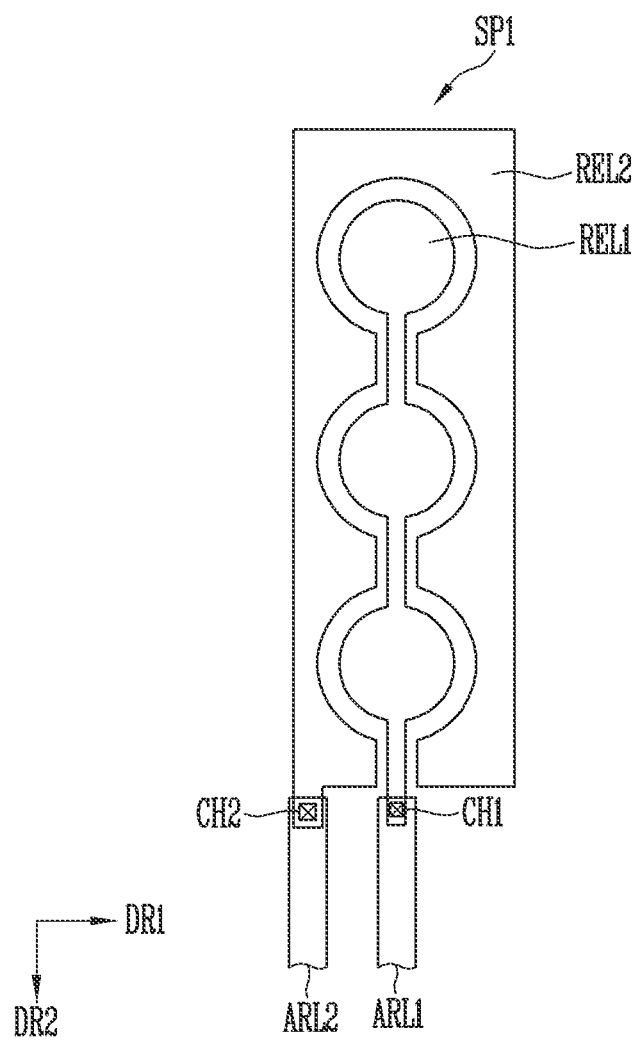
Figure 20A:
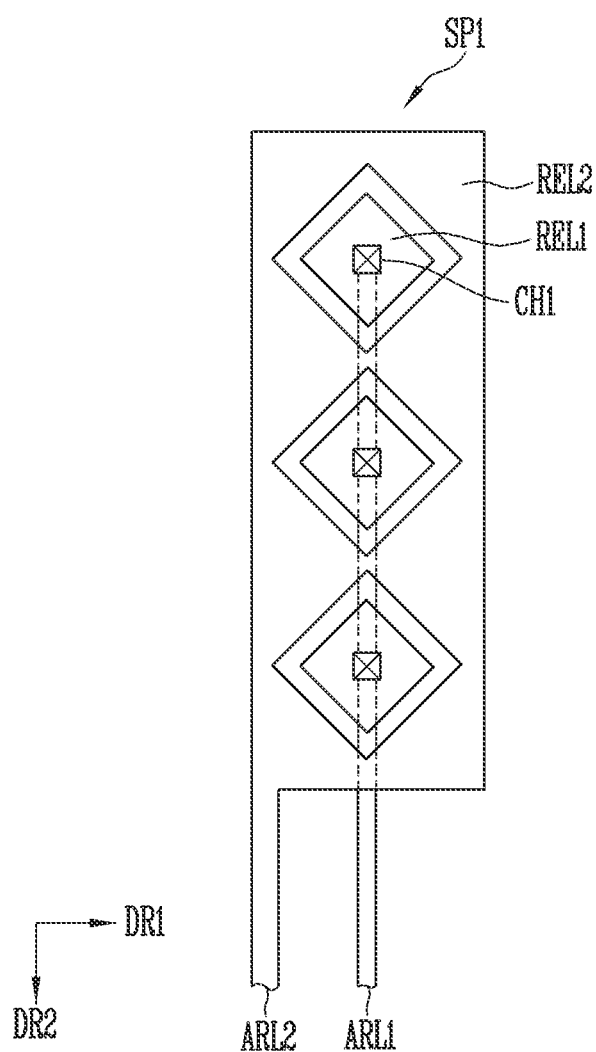
Figure 20B:
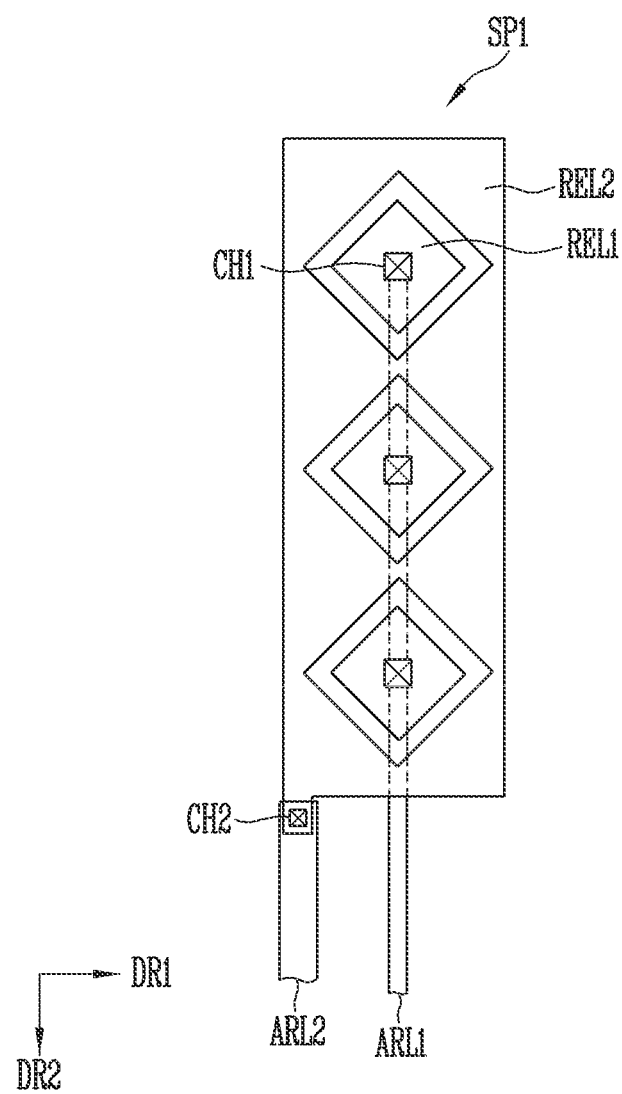
Figure 20C:
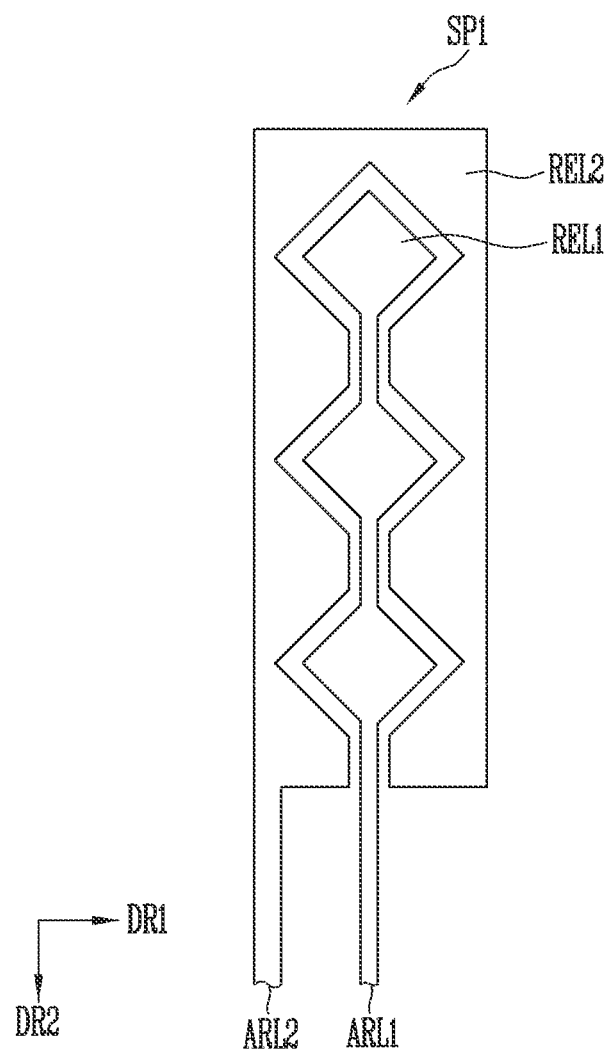

FIGS. 17A to 17C are plan views illustrating another embodiment of the first and second alignment lines and the first and second electrodes, which are disposed in one pixel, in the display device of FIG. 11. In this embodiment, portions different from those of the above-described embodiment will be mainly described to avoid redundancy. Portions not particularly described in this embodiment follow those of the above-described embodiment. In addition, identical reference numerals refer to identical components, and similar reference numerals refer to similar components.

Referring to FIGS. 11 and 17A to 17C, the display device according to the embodiment of the present invention may include a substrate on which a plurality of pixels PXL are provided. Each pixel PXL may include first to third sub-pixel SP1 to SP3.

The first sub-pixel SP1 may include first and second electrodes REL1 and REL2 electrically separated from each other, a first alignment line ARL1 connected to the first electrode REL1, and a second alignment line ARL2 connected to the second electrode REL2.

The first alignment line ARL1 may extend along a second direction DR2, and be integrally provided with the first electrode REL1. The second alignment line ARL2 may extend along the second direction DR2, and be integrally provided with the second electrode REL2.

A unit light emitting region of the first sub-pixel SP1 may include first and second sub-light emitting regions SEMA1 and SEMA2.

The first electrode REL1 may include (1-1)th and (1-2)th electrodes REL1_1 and REL1_2 branching off from the first alignment line ARL1. The second electrode REL2 may include (2-1)th and (2-2)th electrodes REL2_1 and REL2_2 branching off from the second alignment line ARL2.

The (1-1)th and (2-1)th electrodes REL1_1 and REL2_1 may be provided in the first sub-light emitting region SEMA1, and the (1-2)th and (2-2)th electrodes REL1_2 and REL2_2 may be provided in the second sub-light emitting region SEMA2.

In the first sub-light emitting region SEMA1, the (2-1)th electrode REL2_1 may be provided in a shape surrounding the periphery of the (1-1)th electrode REL1_1. The (1-1)th electrode REL1_1 and the (2-1)th electrode REL2_1 may be spaced apart from each other at a certain distance to be in a state in which the (1-1)th electrode REL1_1 and the (2-1)th electrode REL2_1 are electrically separated from each other.

When viewed on a plane, the (1-1)th electrode REL1_1 may be provided in a quadrangular shape, a circular shape, a polygonal shape or the like. However, the present invention is not limited thereto, and the (1-1)th electrode REL1_1 may be provided in various shapes. The (2-1)th electrode REL2_1 surrounding the periphery of the (1-1)th electrode REL1_1 may be provided in a shape corresponding to that of the (1-1)th electrode REL1_1.

In the second sub-light emitting region SEMA2, the (2-2)th electrode REL2_2 may be provided in a shape surrounding the periphery of the (1-2)th electrode REL1_2. The (1-2)th electrode REL1_2 and the (2-2)th electrode REL2_2 may be spaced apart from each other at a certain distance to be in a state in which the (1-2)th electrode REL1_2 and the (2-2)th electrode REL2_2 are electrically separated from each other.

When viewed on a plane, the (1-2)th electrode REL1_2 may be provided in a quadrangular shape, a circular shape, a polygonal shape or the like.

However, the present invention is not limited thereto, and the (1-2)th electrode REL1_2 may be provided in various shapes. The (2-2)th electrode REL2_2 surrounding the periphery of the (1-2)th electrode REL1_2 may be provided in a shape corresponding to that of the (1-2)th electrode REL1_2.

A distance d1 between the (1-1)th and (2-1)th electrodes REL1_1 and REL2_1 in the first sub-light emitting region SEMA1 and a distance d2 between the (1-2)th and (2-2)th electrodes REL1_2 and REL2_2 in a second sub-light emitting region SEMA2 may be designed to be the same.

When LEDs LD are aligned in the first sub-pixel SP1, a predetermined voltage may be applied to the first and second electrodes REL1 and REL2 respectively through the first and second alignment lines ARL1 and ARL2.

Therefore, an electric field may be formed between the first and second electrodes REL1 and REL2, and the LEDs LD may be aligned between the first and second electrodes REL1 and REL2.

The LEDs LD may be aligned in the second direction DR2 between the first and second electrode REL1 and REL2, and be aligned in a first direction DR1 intersecting the second direction DR2.

The second and third sub-pixels SP2 and SP3 may be provided in the same shape as the first sub-pixel SP1, and therefore, descriptions of the second and third sub-pixels SP2 and SP3 will be omitted.

FIGS. 18A to 18D, FIGS. 19A to 19D, and 20A to 20D are plan views illustrating other embodiments of the first and second alignment lines and the first and second electrodes, which are disposed in one pixel, in the display device of FIG. 11. In this embodiment, portions different from those of the above-described embodiment will be mainly described to avoid redundancy. Portions not particularly described in this embodiment follow those of the above-described embodiment. In addition, identical reference numerals refer to identical components, and similar reference numerals refer to similar components.

Referring to FIGS. 11, 18A to 18D, FIGS. 19A to 19D, and 20A to 20D, the display device according to the embodiment of the present invention may include a substrate SUB on which a plurality of pixels PXL are provided. Each pixel PXL may include first to third sub-pixels SP1 to SP3.

The first sub-pixel SP1 may include first and second electrodes REL1 and REL2 electrically separated from each other, a first alignment line ARL1 connected to the first electrode REL1, and a second alignment line ARL2 connected to the second electrode REL2.

The first alignment line ARL1 may extend along a second direction DR2, be integrally provided with the first electrode REL1, and be disposed in the same layer as the first electrode REL1. However, the present invention is not limited thereto.

In some embodiments, the first alignment line ARL1 may be electrically connected to the first electrode REL1 through a first contact hole CH1 as shown in FIGS. 18A, 18B, 18D, 19A, 19B, 19D, 20A, 20B, and 20D. The first alignment line ARL1 may be provided in a layer different from that of the first electrode REL1.

The second alignment line ARL2 may extend in the second direction DR2, be integrally provided with the second electrode REL2, and be disposed in the same layer as the second electrode REL2. However, the present invention is not limited thereto.

In some embodiments, the second alignment line ARL2 may be electrically connected to the second electrode REL2 through a second contact hole CH2 as shown in FIGS. 18B, 18D, 19B, 19D, 20B, and 20D. The second alignment line ARL2 may be provided in a layer different from that of the second electrode REL2.

At least one first electrode REL1 may be provided in a unit light emitting region of the first sub-pixel SP1.

One of the first and second electrodes REL1 and REL2 may be provided in the other of the first and second electrodes REL1 and REL2. For example, the first electrode REL1 may be disposed in the second electrode REL2, and be electrically separated from the second electrode REL2.

In an embodiment of the present invention, the first electrode REL1 may be provided in a quadrangular shape, a circular shape, a polygonal shape or the like. However, the present invention is not limited thereto, and the first electrode REL1 may be provided in various shapes. The second electrode REL2 surrounding the periphery of the first electrode REL1 may be provided in a shape corresponding to that of the first electrode REL1.

When viewed on a plane, the second electrode REL2 may be provided in a shape surrounding the periphery of the first electrode REL1. The first electrode REL1 may be provided in an isolated island shape surround by the second electrode REL2, but the present invention is not limited thereto.

In some embodiments, a partial region of the first electrode REL1 may not be surrounded by the second electrode REL2 as shown in FIGS. 18C, 18D, 19C, 19D, 20C, and 20D. The first electrode REL1 may be integrally provided with a first electrode REL1 disposed adjacent thereto in the second direction DR2 to be electrically connected.

When the first electrode REL1 has an isolated island shape completely surrounded by the second electrode REL2, the first electrode REL1 may be connected to the first alignment line ARL1 through the first contact hole CH1 as shown in FIGS. 18A, 18B, 19A, 19B, 20A, and 20B.

Also, when the first electrode REL1 has an isolated island shape completely surrounded by the second electrode REL2, the first electrode REL1 may be spaced apart from a first electrode REL1 disposed adjacent thereto in the second direction DR2 at a certain distance.

When LEDs LD are aligned in the first sub-pixel SP1, a predetermined voltage may be applied to the first and second electrodes REL1 and REL2 respectively through the first and second alignment lines ARL1 and ARL2. Therefore, an electric field may be formed between the first and second electrodes REL1 and REL2.

The LEDs LD may be aligned along the periphery of the first electrode REL1 in the unit light emitting region of the first sub-pixel SP1 by the electric field formed between the first and second electrodes REL1 and REL2. The LEDs LD may be aligned in various directions.

When the first electrode REL1 has a quadrangular shape as shown in FIGS. 18A to 18D, some of the LEDs LD may be aligned in the first direction DR1, other some of the LEDs LD may be aligned in the second direction DR2, and the others of the LEDs LD may be aligned in an oblique direction between the first and second directions DR1 and DR2.

When the first electrode REL1 has a circular shape as shown in FIGS. 19A to 19D, an electric field having a radial shape may be formed between the first and second electrodes REL1 and REL2. Therefore, the LEDs LD may be aligned in various directions along the circumference of the first electrode REL1.

When the first electrode REL1 has a rhombus shape that is a polygonal shape as shown in FIGS. 20A to 20D, most of the LEDs LD may be aligned in an oblique direction between the first and second directions DR1 and DR2, and the others of the LEDs LD may be aligned in the first direction DR1 and/or the second direction DR2.

Meanwhile, as shown in FIGS. 18C, 18D, 19C, 19D, 20C, and 20D, when a partial region of the first electrode REL1 is not surrounded by the second electrode REL2, the electric field may be concentrated on the partial region. The LEDs LD may be biased and aligned in the partial region.

In order to prevent this, a shielding means (not shown) is disposed in the partial region, so that the electric field concentrated on the partial region can be partially shielded.

The second and third sub-pixels SP2 and SP3 may be provided in the same shape as the first sub-pixel SP1, and therefore, descriptions of the second and third sub-pixels SP2 and SP3 will be omitted.

The display device according to the embodiment of the present disclosure can be employed in various electronic devices. For example, the display device is applicable to televisions, notebook computers, cellular phones, smart phones, smart pads, PMPs, PDAs, navigation systems, various wearable devices such as smart watches, and the like.

While the present invention has been described in connection with the preferred embodiments, it will be understood by those skilled in the art that various modifications and changes can be made thereto without departing from the spirit and scope of the invention defined by the appended claims.

Thus, the scope of the invention should not be limited by the particular embodiments described herein but should be defined by the appended claims and equivalents thereof.

The invention claimed is:

1. A light emitting device comprising:
    a substrate including a plurality of unit light emitting regions;
    at least one first light emitting element on the substrate, the at least one first light emitting element having a first end portion and a second end portion along a first direction;
    at least one second light emitting element having a first end portion and a second end portion along a second direction intersecting the first direction such that a length direction of a largest dimension of the at least one second light emitting element is substantially perpendicular to a length direction of a largest dimension of the at least one first light emitting element;
    a first electrode connected to any one of the first and second end portions of each of the at least one first and second light emitting elements and a second electrode connected to the other of the first and second end portions of each of the at least one first and second light emitting elements;
    a first alignment line extending along the second direction on the substrate, the first alignment line being connected to the first electrode; and
    a second alignment line spaced apart from the first alignment line by a distance, the second alignment line being connected to the second electrode.

2. The light emitting device of claim 1, wherein each of the plurality of unit light emitting regions includes a first sub-light emitting region in which the at least one first light emitting element is provided and a second sub-light emitting region in which the at least one second light emitting element is provided.

3. The light emitting device of claim 2, wherein the first electrode includes a (1-1)th electrode in the first sub-light emitting region and a (1-2)th electrode in the second sub-light emitting region, and
    the second electrode includes a (2-1)th electrode in the first sub-light emitting region and a (2-2)th electrode in the second sub-light emitting region.

4. The light emitting device of claim 3, wherein the (1-1)th electrode and the (2-1)th electrode extend along the second direction, and
    the (1-2)th electrode and the (2-2)th electrode extend along the first direction.

5. The light emitting device of claim 4, wherein a distance between the (1-1)th electrode and the (2-1)th electrode is equal to a distance between the (1-2)th electrode and the (2-2)th electrode.

6. The light emitting device of claim 5, further comprising:
    a first connection line extending in the first direction on the substrate, the first connection line electrically connecting the first alignment line and the first electrode; and
    a second connection line extending in parallel to the first connection line on the substrate, the second connection line electrically connecting the second alignment line and the second electrode.

7. The light emitting device of claim 6, wherein the (1-1)th electrode branches off to the first sub-light emitting region along the second direction from the first connection line,
    the (2-1)th electrode branches off to the first sub-light emitting region along the second direction from the second connection line, and
    the (1-1)th electrode and the (2-1)th electrode are alternately disposed along the first direction in the first sub-light emitting region.

8. The light emitting device of claim 6, wherein the (1-2)th electrode branches off to the second sub-light emitting region along the first direction from the first alignment line,
    the (2-2)th electrode branches off to the second sub-light emitting region along the first direction from the second alignment line, and
    the (1-2)th electrode and the (2-2)th electrode are alternately disposed along the second direction in the second sub-light emitting region.

9. The light emitting device of claim 6, wherein the first connection line includes one end portion connected to the first alignment line and the other end portion opposite to the one end portion,
    wherein the other end portion has a round shape.

10. The light emitting device of claim 6, wherein a distance between one of the (1-2)th and (2-2)th electrodes, which is disposed at an uppermost side of the second sub-light emitting region, and the first connection line is larger than that the distance between the (1-2)th electrode and the (2-2)th electrode.

11. The light emitting device of claim 2, further comprising:
- a first bank between the substrate and the first electrode;
- a second bank between the substrate and the second electrode, the second bank being spaced apart from the first bank by a distance;
- a first contact electrode on the first electrode, the first contact electrode connecting any one of first and second end portions of a corresponding light emitting element and the first electrode; and
- a second contact electrode on the second electrode, the second contact electrode connecting the other of the first and second end portions of the corresponding light emitting element and the second electrode.

12. The light emitting device of claim 11, further comprising:
- a first insulating layer between the substrate and the at least one first and second light emitting elements;
- a second insulating layer over the at least one first and second light emitting elements, the second insulating layer exposing the first and second end portions of each of the at least one first and second light emitting elements;
- a third insulating layer over the first contact electrode to cover the first contact electrode; and
- a fourth insulating layer over the second contact electrode to cover the second contact electrode.

13. The light emitting device of claim 12, further comprising, when viewed on a plane, a first insulating pattern overlapping with a portion of the first alignment line and a second insulating pattern overlapping with a portion of the second alignment line,
wherein the first and second insulating patterns are provided in the same layer as the first insulating layer, and shield a portion of an electric field formed between the first and second electrodes.

14. The light emitting device of claim 13, further comprising a first conductive pattern on the first insulating pattern and a second conductive pattern on the second insulating pattern,
wherein the first and second conductive patterns are in the same layer as the first contact electrode.

15. A light emitting device comprising:
- a substrate including a plurality of unit light emitting regions;
- at least one first light emitting element on the substrate, the at least one first light emitting element having a first end portion and a second end portion along a first direction;
- at least one second light emitting element having a first end portion and a second end portion along a second direction intersecting the first direction;
- a first electrode connected to any one of the first and second end portions of each of the at least one first and second light emitting elements and a second electrode connected to the other of the first and second end portions of each of the at least one first and second light emitting elements;
- a first alignment line extending along the second direction on the substrate, the first alignment line being connected to the first electrode; and
- a second alignment line spaced apart from the first alignment line by a distance, the second alignment line being connected to the second electrode,
wherein the first alignment line is in a same layer as the first electrode, and is integrally provided with the first electrode, and
the second alignment line is in a same layer as the second electrode, and is integrally provided with the second electrode.

16. The light emitting device of claim 15, wherein the first electrode includes a plurality of branch electrodes protruding along the first direction from the first alignment line, and
the second electrode includes a plurality of protrusion electrodes arranged along the second direction and a plurality of voids provided between adjacent protrusion electrodes,
wherein each of the plurality of branch electrodes is provided to correspond to one void.

17. The light emitting device of claim 1, wherein the first electrode and the second electrode are electrically separated from each other, and one of the first and second electrodes has a shape surrounding a periphery of the other of the first and second electrodes.

18. The light emitting device of claim 17, wherein each of the at least one first and second light emitting elements includes:
- a first semiconductor layer doped with a first conductive dopant;
- a second semiconductor layer doped with a second conductive dopant; and
- an active layer between the first semiconductor layer and the second semiconductor layer.

19. The light emitting device of claim 18, wherein each of the at least one first and second light emitting elements includes a cylindrical column-shaped or polygonal column-shaped light emitting diode having a micro or nano scale.

20. A display device comprising:
- a substrate including a display region and a non-display region;
- a pixel circuit layer in the display region, the pixel circuit layer including at least one transistor; and
- a display element layer on the pixel circuit layer, the display element layer including a plurality of unit light emitting regions from which light is emitted,
wherein the display element layer includes:
- at least one first light emitting element on the pixel circuit layer, the at least one first light emitting element having a first end portion and a second end portion in a first direction;
- at least one second light emitting element having a first end portion and a second end portion in a second direction intersecting the first direction such that a length direction of a largest dimension of the at least one second light emitting element is substantially perpendicular to a length direction of a largest dimension of the at least one first light emitting element;
- a first electrode connected to any one of the first and second end portions of each of the at least one first and second light emitting elements and a second electrode connected to the other of the first and second end portions of each of the at least one first and second light emitting elements, wherein the first electrode and the second electrode are on the pixel circuit layer;
- a first alignment line extending along the second direction on the pixel circuit layer, the first alignment line being connected to the first electrode;
- a second alignment line spaced apart from the first alignment line by a distance, the second alignment line being connected to the second electrode;
- a first contact electrode on the first electrode, the first contact electrode connecting any one of first and second end portions of a corresponding light emitting element and the first electrode; and a second contact electrode on the second electrode, the second contact electrode connecting the other of the first and second end portions of the corresponding light emitting element and the second electrode.

* * * * *